(12) United States Patent
Liu et al.

(10) Patent No.: US 11,925,033 B2
(45) Date of Patent: Mar. 5, 2024

(54) EMBEDDED BACKSIDE MEMORY ON A FIELD EFFECT TRANSISTOR

(71) Applicant: Taiwan Semiconductor Manufacturing Co., Ltd., Hsin-Chu (TW)

(72) Inventors: Kuan-Liang Liu, Pingtung (TW); Sheng-Chau Chen, Tainan (TW); Chung-Liang Cheng, Changhua County (TW); Chia-Shiung Tsai, Hsin-Chu (TW); Yeong-Jyh Lin, Caotun Township (TW); Pinyen Lin, Rochester, NY (US); Huang-Lin Chao, Hillsboro, OR (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 261 days.

(21) Appl. No.: 17/217,000

(22) Filed: Mar. 30, 2021

(65) Prior Publication Data

US 2022/0320180 A1 Oct. 6, 2022

(51) Int. Cl.
*H01L 29/423* (2006.01)
*H01L 21/02* (2006.01)
*H01L 21/285* (2006.01)
*H01L 29/06* (2006.01)
(Continued)

(52) U.S. Cl.
CPC ....... *H10B 61/22* (2023.02); *H01L 21/02603* (2013.01); *H01L 21/28518* (2013.01);
(Continued)

(58) Field of Classification Search
CPC ........ H10B 61/00; H10B 61/20; H10B 61/22; H01L 23/5286; H01L 23/481;
(Continued)

(56) References Cited

U.S. PATENT DOCUMENTS

2018/0240871 A1   8/2018   Cheng et al.
2018/0337261 A1*  11/2018  Bergendahl ....... H01L 21/30604
(Continued)

*Primary Examiner* — Eric K Ashbahian
*Assistant Examiner* — Halee Cramer
(74) *Attorney, Agent, or Firm* — Eschweiler & Potashnik, LLC

(57) ABSTRACT

In some embodiments, the present disclosure relates to an integrated chip that includes a first and second transistors arranged over a substrate. The first transistor includes first channel structures extending between first and second source/drain regions. A first gate electrode is arranged between the first channel structures, and a first protection layer is arranged over a topmost one of the first channel structures. The second transistor includes second channel structures extending between the second source/drain region and a third source/drain region. A second gate electrode is arranged between the second channel structures, and a second protection layer is arranged over a topmost one of the second channel structures. The integrated chip further includes a first interconnect structure arranged between the substrate and the first and second channel structures, and a contact plug structure coupled to the second source/drain region and arranged above the first and second gate electrodes.

20 Claims, 20 Drawing Sheets

(51) Int. Cl.
*H01L 29/45* (2006.01)
*H01L 29/66* (2006.01)
*H01L 29/786* (2006.01)
*H10B 61/00* (2023.01)

(52) U.S. Cl.
CPC .... *H01L 29/0673* (2013.01); *H01L 29/42392* (2013.01); *H01L 29/45* (2013.01); *H01L 29/66545* (2013.01); *H01L 29/66553* (2013.01); *H01L 29/66742* (2013.01); *H01L 29/78696* (2013.01)

(58) Field of Classification Search
CPC ......... H01L 23/53209; H01L 23/53228; H01L 23/53242; H01L 23/53257; H01L 21/76898; H01L 21/8221; H01L 27/0694; H01L 29/42392
See application file for complete search history.

(56) References Cited

U.S. PATENT DOCUMENTS

| | | | |
|---|---|---|---|
| 2019/0006416 A1 | 1/2019 | Lee et al. | |
| 2020/0051980 A1* | 2/2020 | Liaw | H01L 21/76897 |
| 2020/0066894 A1 | 2/2020 | Frougier et al. | |
| 2020/0161574 A1 | 5/2020 | Vasen et al. | |
| 2020/0294998 A1 | 9/2020 | Lilak et al. | |
| 2020/0388502 A1* | 12/2020 | Kim | H01L 29/66795 |
| 2021/0104661 A1* | 4/2021 | Lee | H10N 50/01 |
| 2021/0408249 A1* | 12/2021 | Yu | H01L 29/66545 |
| 2022/0115340 A1* | 4/2022 | Aktas | H01L 23/5286 |
| 2022/0157723 A1* | 5/2022 | Park | H01L 23/535 |

\* cited by examiner

EMBEDDED BACKSIDE MEMORY ON A FIELD EFFECT TRANSISTOR

BACKGROUND

As technology advances at a rapid pace, engineers work to make devices smaller, yet more complex to improve and develop electronic devices that are more efficient, more reliable, and have more capabilities. One way to achieve these goals is by improving the design of transistors, as electronic devices comprise a plethora of transistors that together, carry out the function of the device. Overall electronic device performance may benefit from transistors that, for example, are smaller in the horizontal and vertical directions, consume less power, and have faster switching speeds.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
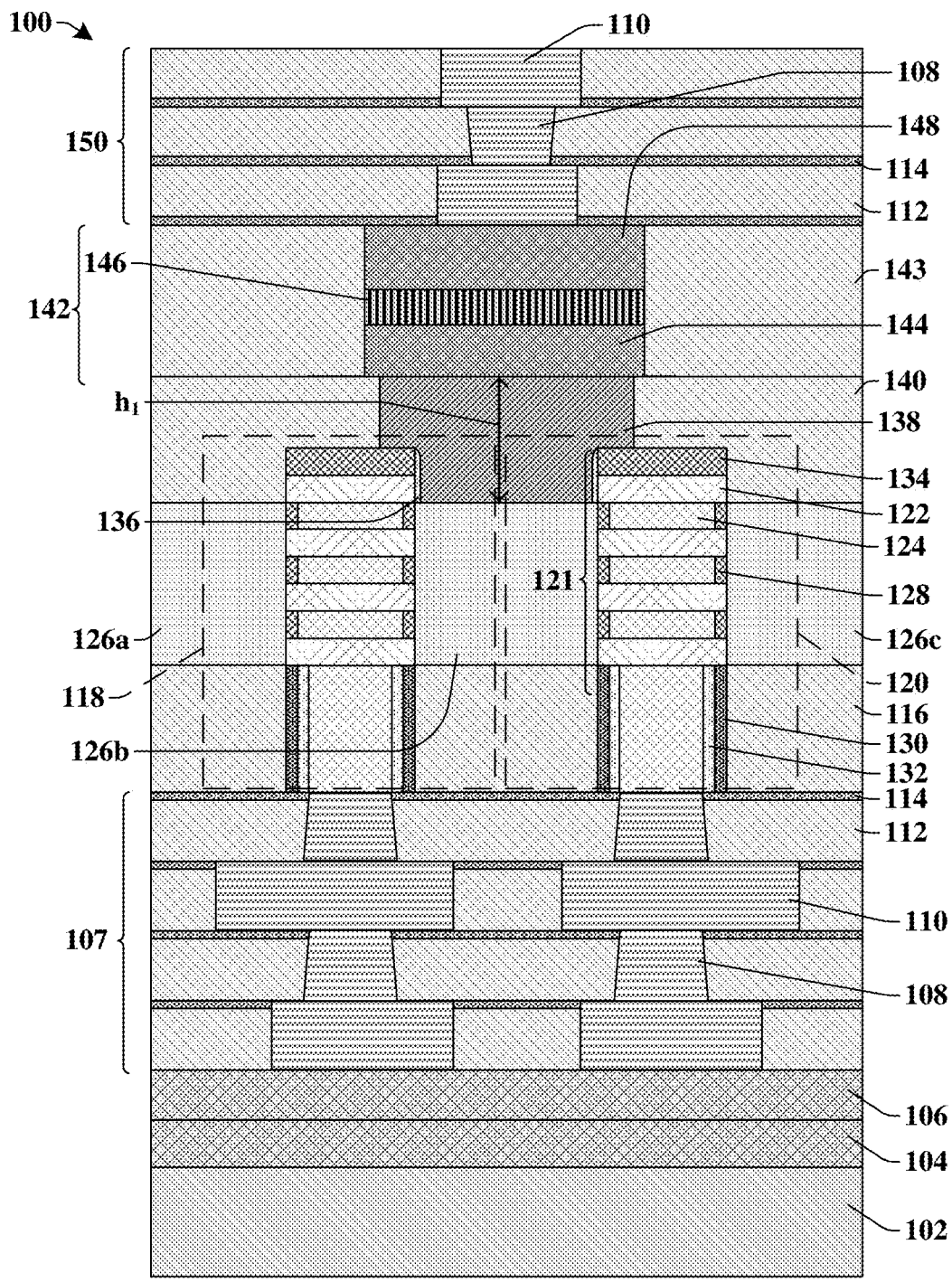
FIG. 1 illustrates a cross-sectional view of some embodiments of an integrated chip having a first interconnect structure arranged below nanosheet field effect transistors (NSFET) and a memory structure arranged above the NSFETs and coupled to the NSFETs using a contact plug structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit may comprise, in some embodiments, multiple transistor devices arranged over a same substrate. In some configurations, an interconnect structure may be arranged over the one or more transistor devices on a frontside of the same substrate. The interconnect structure may comprise a network of interconnect wires and interconnect vias embedded in an interconnect dielectric structure. The interconnect wires and interconnect vias may be electrically coupled to one or more of the multiple transistor devices.

In integrated circuits comprising memory devices, a memory structure (e.g., a magnetoresistive random-access memory cell, a metal-insulator-metal memory cell, a ferroelectric random-access memory cell, a phase-change random-access memory cell, resistive random access memory cell, etc.) may be arranged within the interconnect structure and coupled to at least one of the multiple transistor devices. However, due to physical and/or electrical limitations to prevent signal interference, for example, the memory structure may be conventionally arranged between interconnect wires 5 and 6. Because so many interconnect wires and interconnect vias are arranged between the memory structure and the one or more multiple transistors, the height of the integrated circuit is increased which decreases device density and the distance for a signal to travel between the memory structure and the one or more multiple transistors may be inefficient.

Various embodiments of the present disclosure are directed towards an integrated chip comprising a first transistor and a second transistor spaced apart by a second source/drain region and arranged over a carrier substrate. In some embodiments, the first and second transistors may be nanosheet field effect transistors (NSFET), fin field effect transistors (finFET), or some other type of transistor. A first interconnect structure is arranged between the carrier substrate and the first and second transistors. A contact plug structure is arranged directly over and electrically coupled to the second source/drain region, and a memory structure is arranged directly over and electrically coupled to the contact plug structure. In some embodiments, a second interconnect structure may be arranged directly over and coupled to the memory structure.

Thus, in various embodiments of the present disclosure, a frontside and a backside of the first and second transistors are utilized to reduce the first and/or second interconnect structures dimensions in the vertical direction to increase device density. Further, the contact plug structure is arranged directly between the first and/or second transistors and the memory structure, thereby reducing the distance for a signal traveling between the first and/or second transistors and the memory structure to increase the reliability of the integrated chip.

FIG. 1 illustrates a cross-sectional view 100 of some embodiments of an integrated chip comprising a memory structure arranged above nanosheet field effect transistors (NSFETs) and a first interconnect structure arranged below the NSFETs.

The integrated chip of the cross-sectional view 100 includes a first interconnect structure 107 arranged over a carrier substrate 102. In some embodiments, the first interconnect structure 107 is bonded to the carrier substrate 102 through a first bonding layer 104 and a second bonding layer 106. The first interconnect structure 107 may comprise interconnect wires 110 and interconnect vias 108 arranged within interconnect dielectric layers 112 and interconnect etch stop layers 114. In some embodiments, from the perspective of the cross-sectional view 100 of FIG. 1, wherein the first interconnect structure 107 is arranged above the carrier substrate 102, the interconnect vias 108 of the first interconnect structure 107 may each have an upper surface that is narrower than its bottom surface.

In some embodiments, a first nanosheet field effect transistor (NSFET) 118 is arranged over the first interconnect structure 107, and a second NSFET 120 is arranged over the first interconnect structure 107 and beside the first NSFET 118. In some embodiments, the first and second NSFETs each comprise a channel structure 121 comprising nanosheet channel structures 122, and a gate electrode 124 arranged between the nanosheet channel structures 122. The gate electrode 124 comprises portions arranged directly between the nanosheet channel structures 122 and a portion arranged below a bottommost one of the nanosheet channel structures 122 and coupled to one of the interconnect vias 108 of the first interconnect structure 107. In some embodiments, inner spacer structures 128 surround outer sidewalls of the portions of the gate electrode 124 arranged directly between the nanosheet channel structures 122. Further, in some embodiments, a first gate sidewall structure 132 is arranged on outer sidewalls of the portion of the gate electrode 124 arranged directly between the bottommost one of the nanosheet channel structures 122 and the first interconnect structure 107, and a second gate sidewall structure 130 is arranged directly on outer sidewalls of the first gate sidewall structure 132. Further, in some embodiments, first and second gate sidewall structures 132, 130 are arranged within and laterally surrounded by a gate dielectric layer 116.

In some embodiments, the first NSFET 118 comprises a first source/drain region 126a and a second source/drain region 126b, wherein the nanosheet channel structures 122 of the first NSFET 118 extend between the first and second source/drain regions 126a, 126b. In some embodiments, the second NSFET 120 comprises the second source/drain region 126b and a third source/drain region 126c, wherein the nanosheet channel structures 122 of the second NSFET 120 extend between the second and third source/drain regions 126b, 126c. Thus, in some embodiments, the first and second NSFETs 118, 120 share the second source/drain region 126b. Further, in some embodiments, the first, second, and third source/drain regions 126a, 126b, 126c are separated from the first interconnect structures 107 by the gate dielectric layer 116.

In some embodiments, the first and second NSFETs 118, 120 respectively comprise a protection layer 134 arranged over a topmost one of the nanosheet channel structures 122. In such embodiments, the protection layer 134 may be centered over and comprise a substantially same width as the topmost one of the nanosheet channel structures 122. In some embodiments, the protection layer 134 may comprise, for example, a dielectric material such as silicon nitride, silicon oxynitride, silicon carbide, silicon nitrogen carbide, or some other suitable dielectric material. Thus, in some embodiments, the topmost one of the nanosheet channel structures 122 has a bottom surface that directly contacts the gate electrode 124 and a top surface that directly contacts the protection layer 134.

In some embodiments, the integrated chip of FIG. 1 further comprises a contact dielectric layer 140 arranged over the first and second NSFETs 118, 120 and a contact plug structure 138 that extends through the contact dielectric layer 140 and directly contacts the second source/drain region 126b. Thus, in some embodiments, the contact plug structure 138 is electrically coupled to the first and second NSFETs 118, 120. Further, in some embodiments, the contact plug structure 138 directly overlies the protection layers 134 of the first and second NSFETs 118, 120 and also extends below the protection layers 134 of the first and second NSFETs 118, 120. In some embodiments, the contact plug structure 138 is also arranged directly between topmost ones of the nanosheet channel structures 122 of the first and second NSFETs 118, 120. In some embodiments, a barrier structure 136 is arranged directly between the contact plug structure 138 and the topmost ones of the nano sheet channel structures 122 of the first and second NSFETs 118, 120 to provide protection to the topmost ones of the nanosheet channel structures 122 of the first and second NSFETs 118, 120 during formation of the contact plug structure 138. Similarly, in some embodiments, the protection layers 134 provide protection to the nanosheet channel structures 122 during the formation of the contact plug structure 138. In some embodiments, the contact plug structure 138 comprises a conductive material such as, for example, tungsten, ruthenium, cobalt, or some other conductive material with a low resistivity. In some embodiments, the contact plug structure 138 has a first height $h_1$ extending between the memory structure 142 and the second source/drain region 126b. In some embodiments, the first height $h_1$ may be in a range of between, for example, approximately 10 nanometers and approximately 300 nanometers.

In some embodiments, a memory structure 142 is arranged directly over the contact plug structure 138 such that the contact plug structure 138 electrically couples the memory structure 142 to the first and second NSFETs 118, 120. In some embodiments, the memory structure 142 may comprise a bottom electrode 144 arranged over the contact plug structure 138, a top electrode 148 arranged over the bottom electrode 144, and a memory storage structure 146 arranged between the bottom and top electrodes 144, 148. In some embodiments, the memory structure 142 may comprise a magnetoresistive random-access memory cell, a metal-insulator-metal memory cell, a ferroelectric random-access memory cell, a phase-change random-access memory cell, a resistive random-access memory cell, or some other memory device. In some embodiments, the memory structure 142 is surrounded by a memory dielectric structure 143 arranged over the contact dielectric layer 140.

In some embodiments, a second interconnect structure 150 may be arranged over and coupled to the memory structure 142. In such embodiments, the second interconnect structure 150 may comprise interconnect wires 110 and interconnect vias 108 embedded in interconnect dielectric layers 112 and interconnect etch stop layers 114. In some embodiments, from the perspective of the cross-sectional view 100 of FIG. 1, wherein the second interconnect structure 150 is arranged above the memory structure 142 and the carrier substrate 102, the interconnect vias 108 of the second interconnect structure 150 may each have an upper surface that is wider than its bottom surface.

Thus, in some embodiments, the memory structure 142 is arranged above the first and second NSFETs 118, 120, and the first interconnect structure 107 is arranged below the first and second NSFETs 118, 120, such that both sides of the first and second NSFETs 118, 120 are being utilized, thereby reducing the height of the overall integrated chip in FIG. 1. Further, in some embodiments, the contact plug structure 138 is arranged directly between the memory structure 1472 and the first and second NSFETs 118, 120 to reduce the distance for signals (e.g., current, voltage) to travel between the first and/or second NSFETs 118, 120 and the memory structure 142, thereby increasing the signal traveling efficiency and overall reliability of the integrated chip.

Figure 2A:
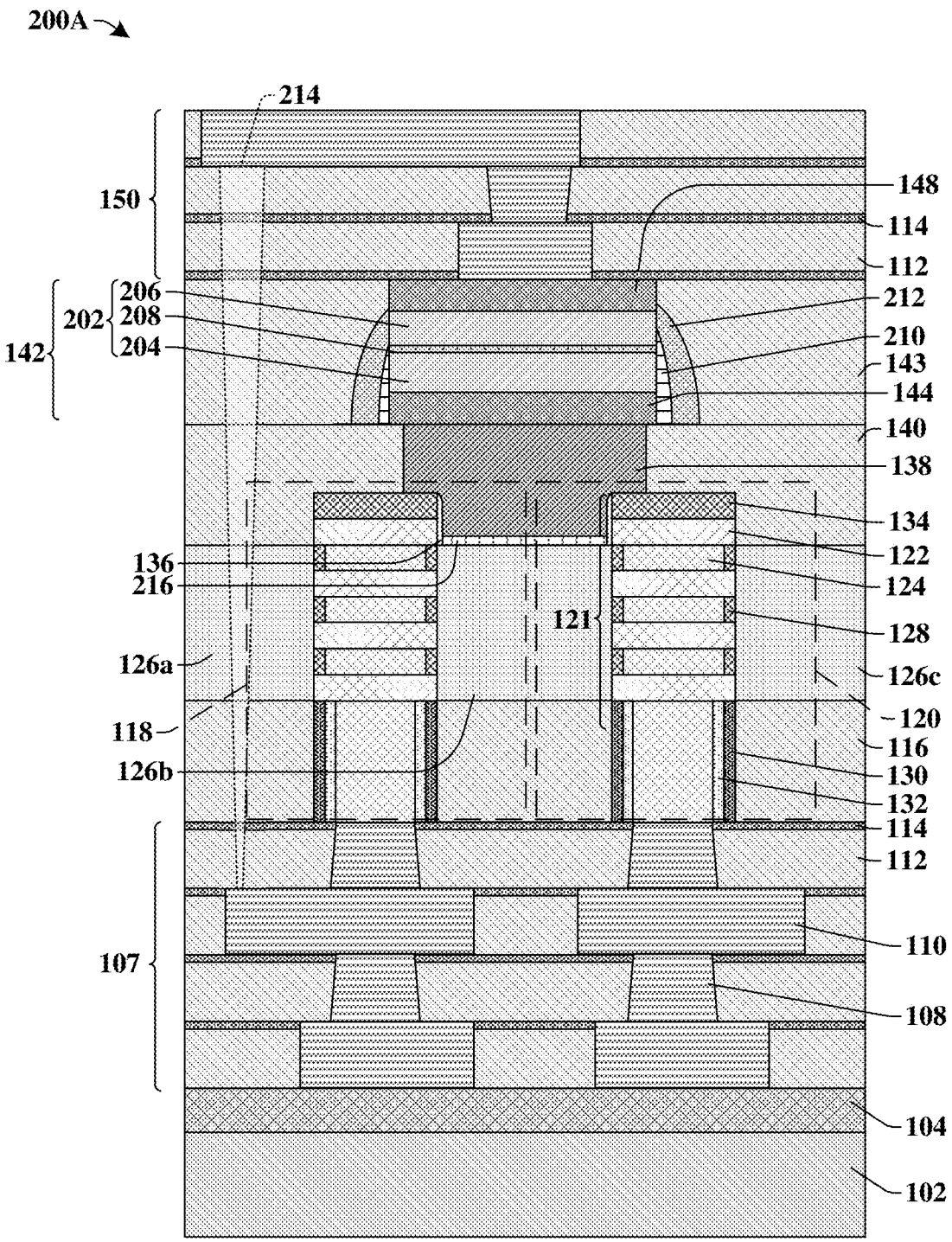
FIG. 2A illustrate a cross-sectional view of some other embodiments of an integrated chip having a first interconnect structure arranged below NSFETs, a memory structure arranged above the NSFETs, a second interconnect structure arranged above the memory structure, and a contact via coupling the first interconnect structure to the second interconnect structure.

FIG. 2A illustrates a cross-sectional view 200A of some other embodiments of an integrated chip comprising a memory structure arranged above NSFETs and a first interconnect structure arranged below the NSFETs.

As shown in cross-sectional view 200A of FIG. 2A, in some embodiments, the memory structure 142 of FIG. 1 may correspond to a magnetoresistive random-access memory (MRAM) cell or device. In such embodiments, a magnetic tunnel junction (MTJ) stack 202 may be arranged between the top electrode 148 and the bottom electrode 144. In some embodiments, the MTJ stack 202 may comprise a thin insulating layer 208 arranged between a bottom magnetic layer 204 and a top magnetic layer 206. Data may be stored in the MTJ stack 202 using magnetic orientations of the MTJ stack 202. In some embodiments, a first MRAM sidewall structure 210 may be arranged on outer sidewalls of the memory structure 142, and a second MRAM sidewall structure 212 may be arranged on outer sidewalls of the first MRAM sidewall structure 210 and/or the outer sidewalls of the memory structure 142.

In some embodiments, a silicide layer 216 is arranged directly between the contact plug structure 138 and the second source/drain region 126b. In some embodiments, the silicide layer 216 may comprise, for example, cobalt silicide, titanium silicide, nickel silicide, or some other suitable metallic silicide material. In such embodiments, the silicide layer 216 may aid in coupling the second source/drain region 126b to the contact plug structure 138.

In some embodiments, the first bonding layer 104 and not the second bonding layer (106 of FIG. 1) is arranged directly between the carrier substrate 102 and the first interconnect structure 107. Further, in some embodiments, the first interconnect structure 107 may be electrically coupled to the second interconnect structure 150. In such embodiments, an elongated via structure 214 may extend through the dielectric layers (e.g., interconnect dielectric layers 112, gate dielectric layer 116, contact dielectric layer 140, memory dielectric structure 143, etc.) to directly couple the first interconnect structure 107 to the second interconnect structure 150. It will be appreciated that in other embodiments, multiple wires and vias and/or some other structure(s) may be used to directly couple the first and second interconnect structures 107, 150.

Figure 2B:
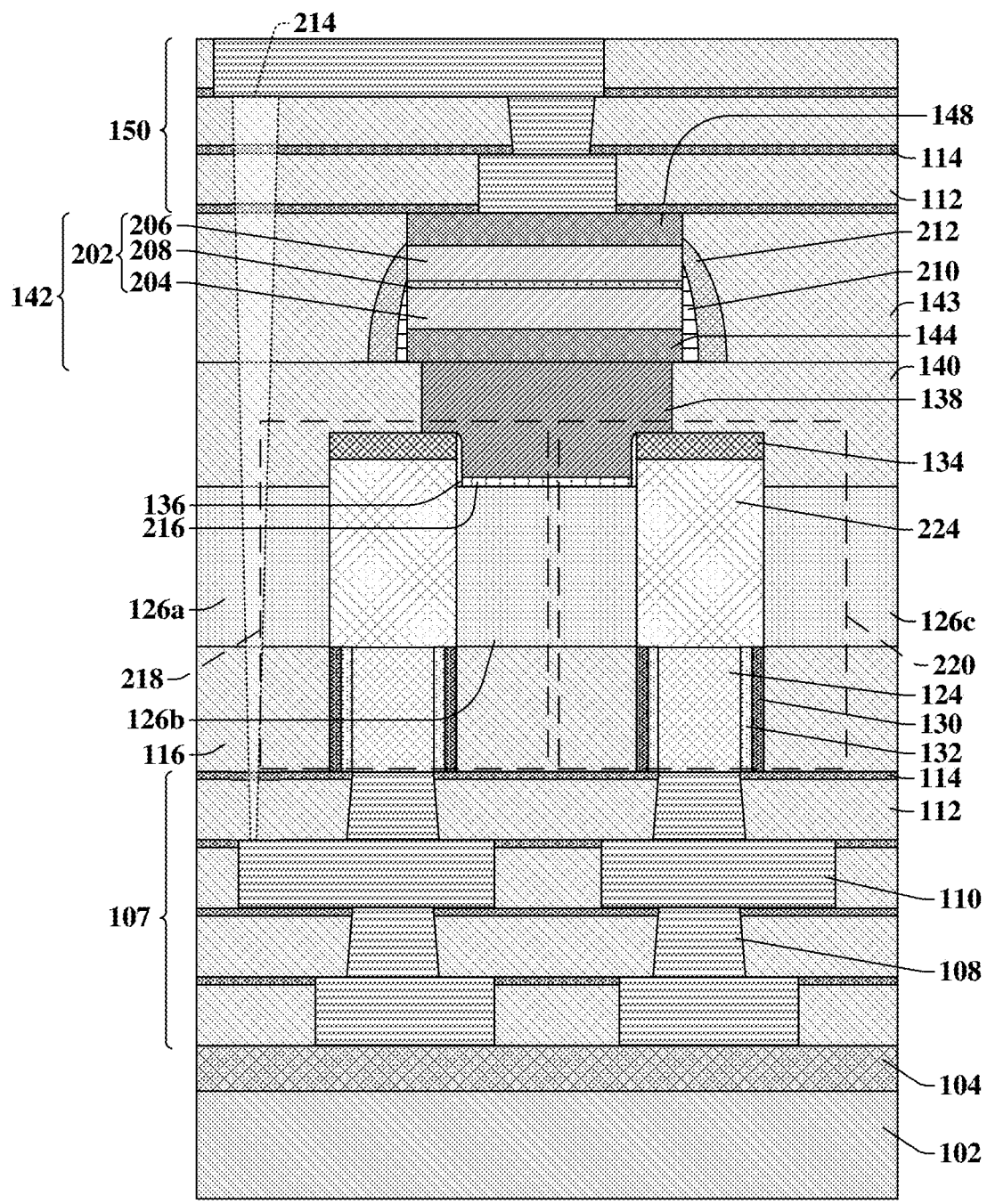
FIG. 2B illustrates a cross-sectional view of some alternative embodiments of FIG. 2A, wherein fin field effect transistors (finFETs) instead of NSFETs are arranged between the memory structure and the first interconnect structure.

FIG. 2B illustrates a cross-sectional view 200B of some alternative embodiments of the cross-sectional view 200A of FIG. 2A, wherein the integrated chip comprising fin field effect transistors (finFETs) instead of NSFETs.

As shown in the cross-sectional view 200B of FIG. 2B, in some embodiments, the integrated chip comprises a first finFET 218 and a second finFET 220 arranged over the first interconnect structure 107 and below the memory structure 142. In such embodiments, the first finFET 218 and the second finFET 220 may each comprise a fin channel structure 224 that continuously extends between the gate electrode 124 and the protection layer 134. In some embodiments, the first and second finFETs 218, 220 may be used instead of the first and second NSFETs (118, 120 of FIG. 1) to reduce manufacturing complexity; however, in some embodiments, the first and second NSFETs (118, 120 of FIG. 1) may provide certain advantages over the first and second finFETs 218, 220 such as, for example, faster switching speeds.

FIGS. 3-23 illustrate cross-sectional views 300-2300 of some embodiments of a method of forming a first interconnect structure below nanosheet field effect transistors (NS-FETs) and a memory structure above the NSFETs. Although FIGS. 3-23 are described in relation to a method, it will be appreciated that the structures disclosed in FIGS. 3-23 are not limited to such a method, but instead may stand alone as structures independent of the method.

Figure 3:
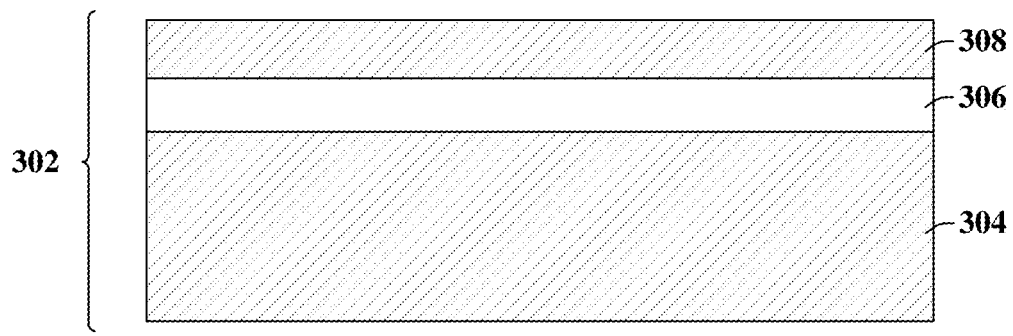
FIGS. 3-23 illustrate cross-sectional views of some embodiments of a method of forming a first interconnect structure on a first side of NSFETs and a memory structure on a second side of NSFETs.

As shown in cross-sectional view 300 of FIG. 3, a first substrate 302 is provided. In some embodiments, the first substrate 302 may be a silicon-on-insulator (SOI) substrate. In such embodiments, the first substrate 302 may comprise a base layer 304, an insulator layer 306 arranged over the base layer 304, and an active layer 308 arranged over the insulator layer 306. In some embodiments, the base layer 304 and the active layer 308 may comprise a semiconductor material such as, for example, silicon, germanium, or the like. In some other embodiments, the first substrate 302 may be a single semiconductor substrate or wafer.

Figure 4:
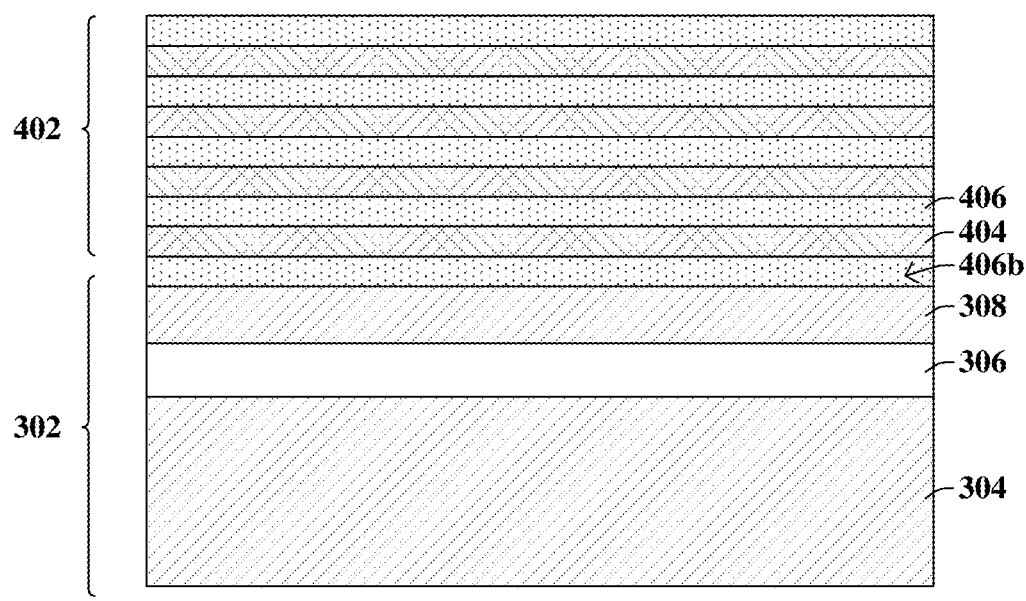

As shown in cross-sectional view 400 of FIG. 4, a stack of semiconductor layers 402 may be formed over first substrate 302. The stack of semiconductor layers 402 may comprise spacer layers 406 and semiconductor layers 404 arranged in an alternating order. In other words, each one of the semiconductor layers 404 may be arranged between a lower one of the spacer layers 406 and an upper one of the spacer layers 406. In some embodiments, the spacer layers 406 comprise a first material, and the semiconductor layers 404 comprise a second material different than the first material. In some embodiments, for example, the first material of the spacer layers 406 comprises germanium silicon or germanium, whereas the second material of the semiconductor layers 404 comprises silicon. In some embodiments, a bottommost layer of the stack of semiconductor layers 402 is a bottommost spacer layer 406b. In such embodiments, the bottommost spacer layer 406b directly contacts the active layer 308 of the first substrate 302. In some embodiments, the semiconductor layers 404 and the spacer layers 406 are formed by an epitaxy growth process.

Figure 5:
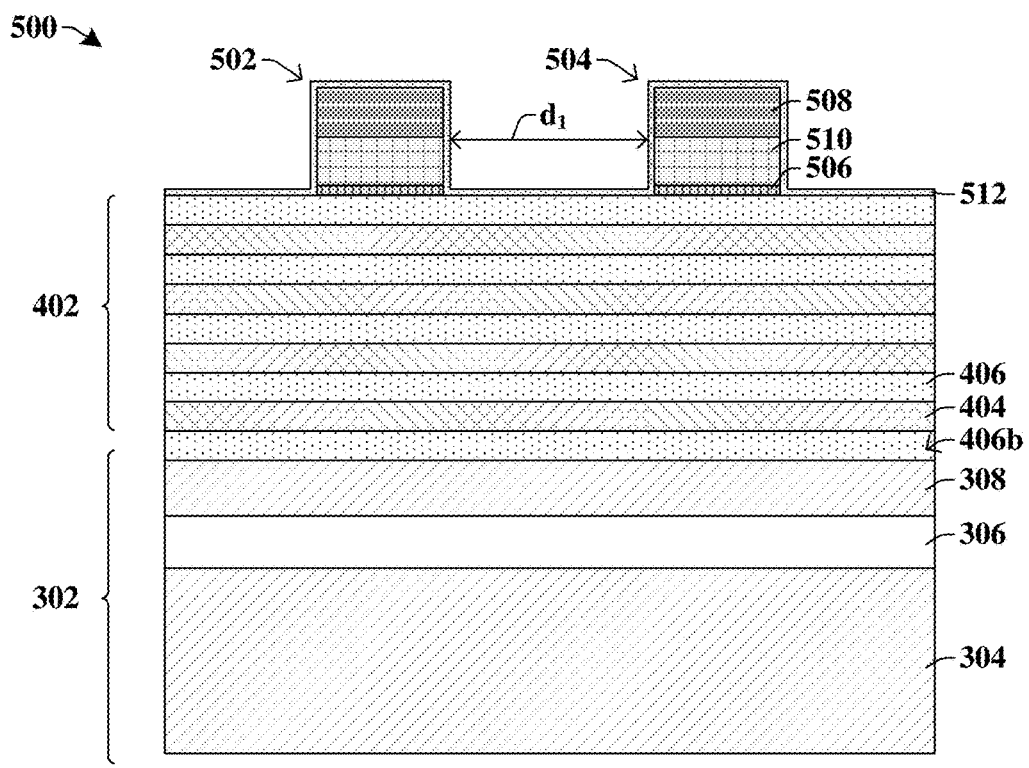

As shown in cross-sectional view 500 of FIG. 5, in some embodiments, a first dummy gate structure 502 and a second dummy gate structure 504 are formed over the stack of semiconductor layers 402. In some embodiments, the first dummy gate structure 502 and the second dummy gate structure 504 comprise a dummy interfacial layer 506 arranged over the stack of semiconductor layers 402, a dummy gate electrode 510 arranged over the dummy interfacial layer 506 and a dummy masking structure 508 arranged over the dummy gate electrode 510. In some embodiments, a conformal first gate layer 512 is formed continuously over the first dummy gate structure 502, the second dummy gate structure 504, and the stack of semiconductor layers 402. In some embodiments, the first dummy gate structure 502 is spaced from the second dummy gate structure 504 by a first distance $d_1$. In some embodiments, the first distance $d_1$ is in a range of between, for example, approximately 2.5 nanometers and approximately 100 nanometers.

In some embodiments, the dummy interfacial layer 506 of the first and second dummy gate structures 502, 504 may comprise, for example, a dielectric material such as a nitride (e.g., silicon nitride, silicon oxynitride), a carbide (e.g., silicon carbide), an oxide (e.g., silicon oxide), or some other suitable material. In some embodiments, the dummy gate electrodes 510 may comprise, for example, polysilicon. In some embodiments, the dummy interfacial layers 506 and the dummy gate electrodes 510 may be formed by way of a thermal oxidation and/or deposition process (e.g., physical vapor deposition (PVD), chemical vapor deposition (CVD), plasma-enhanced CVD (PE-CVD), atomic layer deposition (ALD), etc.) followed by a removal process according to the dummy masking structures 508. In some embodiments, the dummy masking structures 508 may be formed using photolithography and removal (e.g., etching) processes. In some embodiments, the dummy masking structures 508 may comprise a photoresist or hard mask material. In some embodiments, the conformal first gate layer 512 is formed over the dummy masking structures 508 by way of a deposition process (e.g., PVD, CVD, PE-CVD, ALD, etc.). In some embodiments, the conformal first gate layer 512 may comprise an oxide (e.g., silicon dioxide), a nitride (e.g., silicon nitride, silicon oxynitride), a carbide (e.g., silicon carbide), or some other suitable dielectric material.

Figure 6:
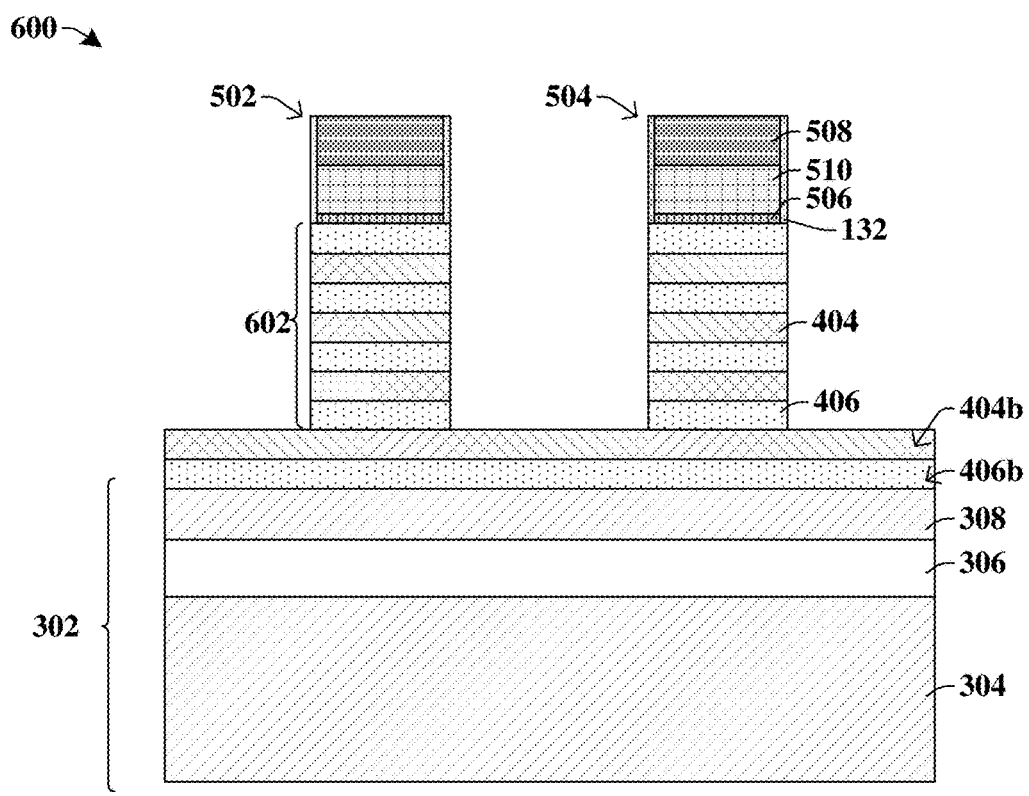

As shown in cross-sectional view 600 of FIG. 6, in some embodiments, a removal process according to the first and second dummy gate structures 502, 504 may be performed to remove upper portions of the stack of semiconductor layers (402 of FIG. 5) to form upper patterned stacks of semiconductor layers 602 arranged directly beneath the first and second dummy gate structures 502, 504. In such embodiments, the removal process of FIG. 6 is controlled by, for example, time, such that the removal process of FIG. 6 does not completely remove a bottommost semiconductor layer 404b. Thus, after the removal process of FIG. 6, the bottommost spacer layer 406b is not removed and is completely covered by the bottommost semiconductor layer 404b.

In some embodiments, the removal process of FIG. 6 may be or comprise an etching process, such as, for example, a dry etching process. The removal process of FIG. 6 may also be performed substantially in the vertical direction. Further, in some embodiments, the removal process of FIG. 6 may remove the portions of the conformal first gate layer (512 of FIG. 5) to form a first gate sidewall structure 132 surrounding outermost sidewalls of the first and second dummy gate structures 502, 504. Further, the dummy masking structure 508 may be substantially resistant to removal by the removal process of FIG. 6, in some embodiments.

Figure 7:
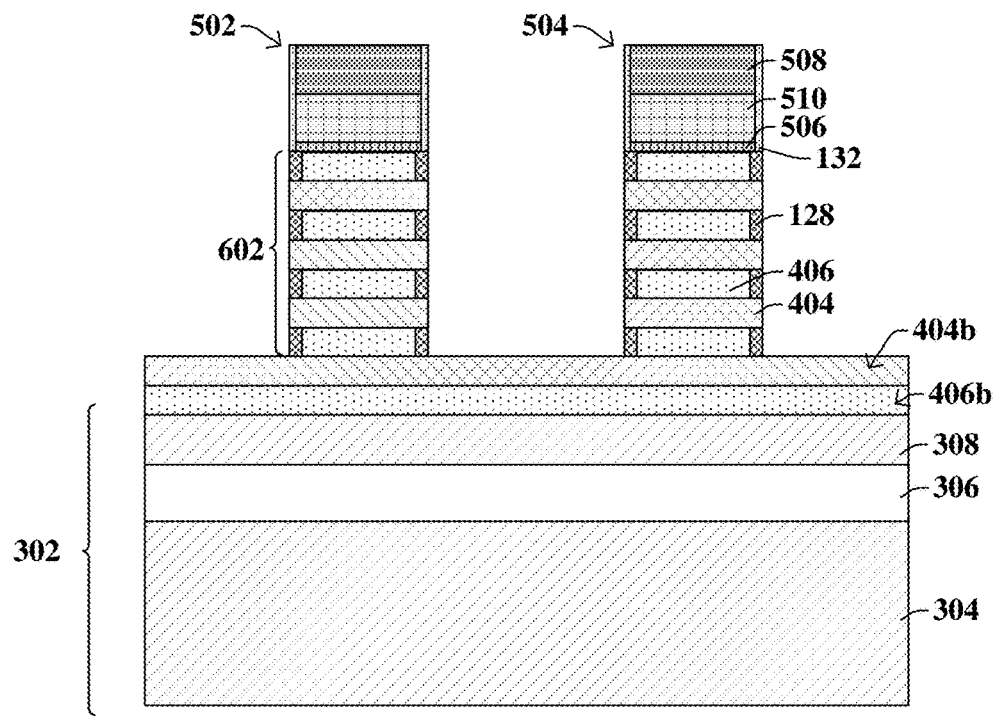

As shown in cross-sectional view 700 of FIG. 7, inner spacer structures 128 are formed on outermost sidewalls of the spacer layers 406. In some embodiments, before forming the inner spacer structures 128, a lateral removal process is performed to outer portions of the spacer layers 406 to reduce the width of the spacer layers 406. In some embodiments, the lateral removal process may comprise an isotropic etching process. Further, in some embodiments, the semiconductor layers 404 are unaffected by the lateral removal process. Then, in some embodiments, an inner spacer material is formed over the bottommost semiconductor layer 404b and over and around the upper patterned stacks of semiconductor layers 602. In some embodiments, a vertical etching process may then be performed to remove portions of the inner spacer material that are not arranged on the outer sidewalls of the spacer layers 406, thereby forming the inner spacer structures 128.

Figure 8:
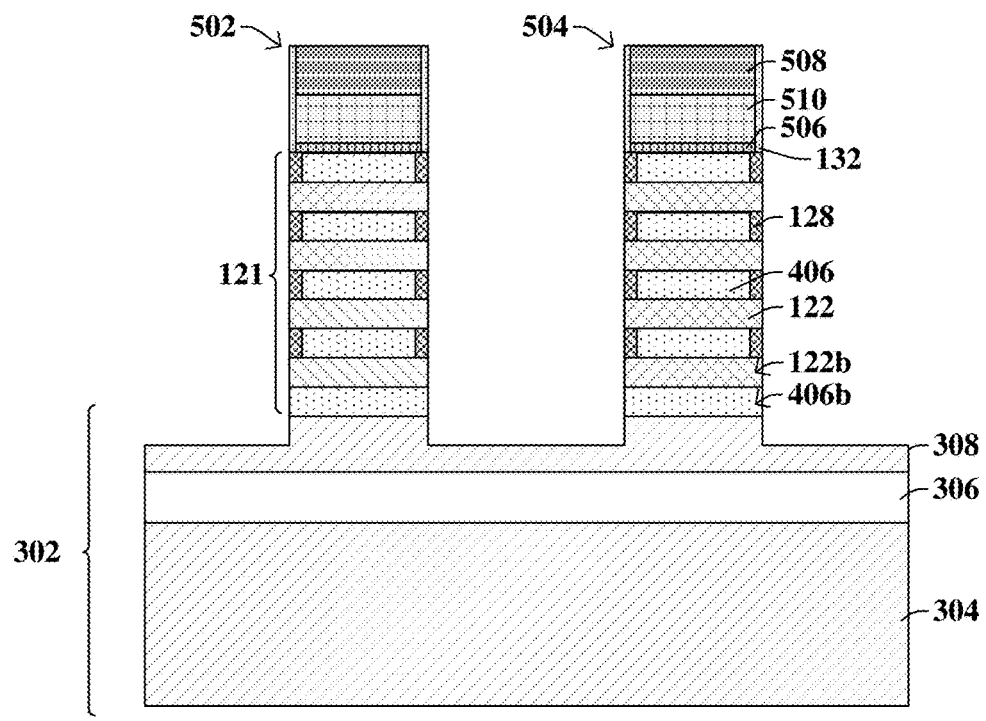

As shown in cross-sectional view 800 of FIG. 8, in some embodiments, a removal process is performed to remove portions of the bottommost semiconductor layer (404b of FIG. 7) and of the bottommost spacer layer (406b of FIG. 7) that do not directly underlie the first or second dummy gate structures 502, 504. In some embodiments, the removal process of FIG. 8 comprises an etching process conducted substantially in the vertical direction. In some embodiments, the removal process of FIG. 8 may also remove portions of the active layer 308 of the first substrate 302.

After the removal process of FIG. 8, channel structures 121 are formed directly below the first and second dummy gate structures 502, 504. In some embodiments, the channel structures 121 may comprise nanosheet channel structures 122 formed from the semiconductor layers (404 of FIG. 7). It will be appreciated that in some embodiments, the channel structures 121 may each comprise more or less than four nanosheet channel structures 122. In some embodiments, a bottommost nanosheet channel structure 122b may be spaced apart from the first substrate 302 by the bottommost spacer layer 406b. The bottommost spacer layer 406b does not comprise inner spacer structures 128.

Figure 9:
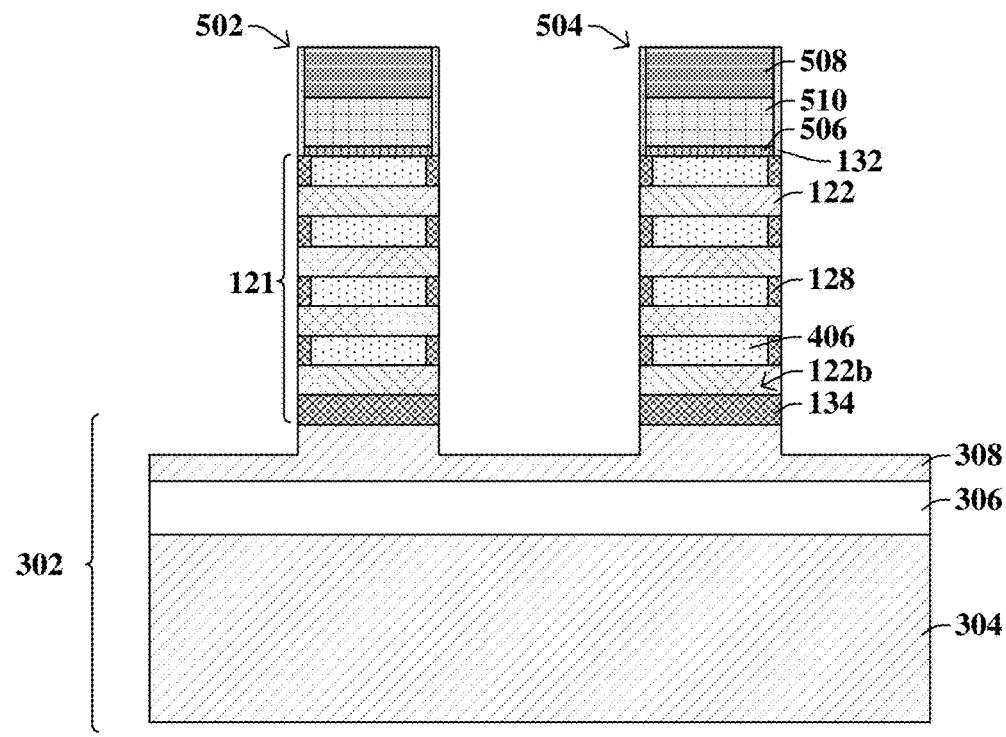

As shown in cross-sectional view 900 of FIG. 9, in some embodiments, the bottommost spacer layer (406b of FIG. 8) may be selectively removed by a removal process, and a protection layer 134 may be formed directly between the bottommost nanosheet channel structure 122b and the first substrate 302. In some embodiments, the removal process of FIG. 9 comprises an isotropic etching process (e.g., wet etch, dry etch) to completely remove the bottommost spacer layer (406b of FIG. 8). Although the spacer layers 406 arranged above the bottommost nanosheet channel structure 122b comprise a same material as the bottommost spacer layer (406b of FIG. 8), the inner spacer structures 128 protect the spacer layers 406 arranged above the bottommost nanosheet channel structure 122b from removal by the removal process of FIG. 9.

After removal of the bottommost spacer layer (406b of FIG. 8), the protection layer 134 may be formed by first forming a protection material over the first substrate 302 and directly between the active layer 308 of the first substrate 302 and the bottommost nanosheet channel structure 122b. Then, in some embodiments, an etching process may be performed according to the first and second dummy gate structures 502, 504 to remove portions of the protection material that do not directly underlie the first and second dummy gate structures 502, 504, thereby forming the protection layer 134.

In some embodiments, the protection layer 134 may comprise a same material as the inner spacer structures 128. In other embodiments, the protection layer 134 may comprise a different material than the inner spacer structures 128. In some embodiments, the protection layer 134 may comprise, for example, a dielectric material such as silicon nitride, silicon oxynitride, silicon carbon nitride, or some other suitable dielectric material.

Figure 10:
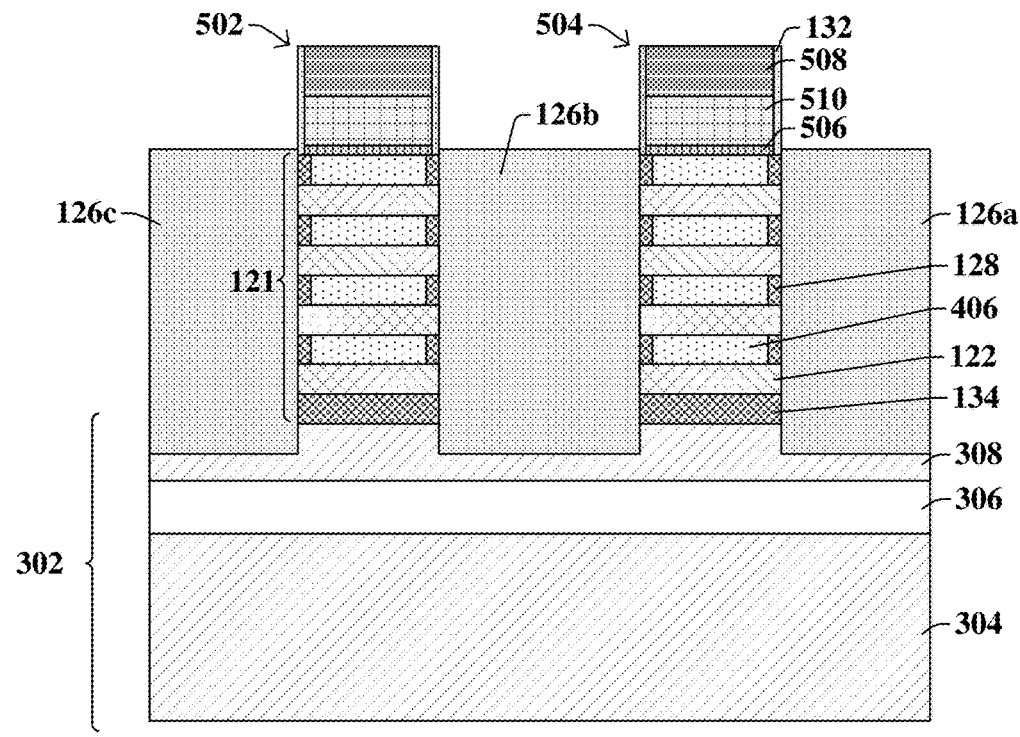

As shown in cross-sectional view 1000 of FIG. 10, in some embodiments, a first source/drain region 126a, a second source/drain region 126b, and a third source/drain region 126c are formed on exposed portions of the active layer 308 of the first substrate 302. In some embodiments, the first, second, and third source/drain regions 126a, 126b, 126c extend from the first substrate 302 to above a topmost one of the nanosheet channel structures 122. Further, the first, second, and third source/drain regions 126a, 126b, 126c directly contact the nanosheet channel structures 122. In some embodiments, the first, second, and third source/drain regions 126a, 126b, 126c are formed by way of an epitaxy growth process and comprise a semiconductor material. For example, in some embodiments, the first, second, and third source/drain regions 126a, 126b, 126c comprise silicon, germanium, or silicon germanium.

Figure 11:
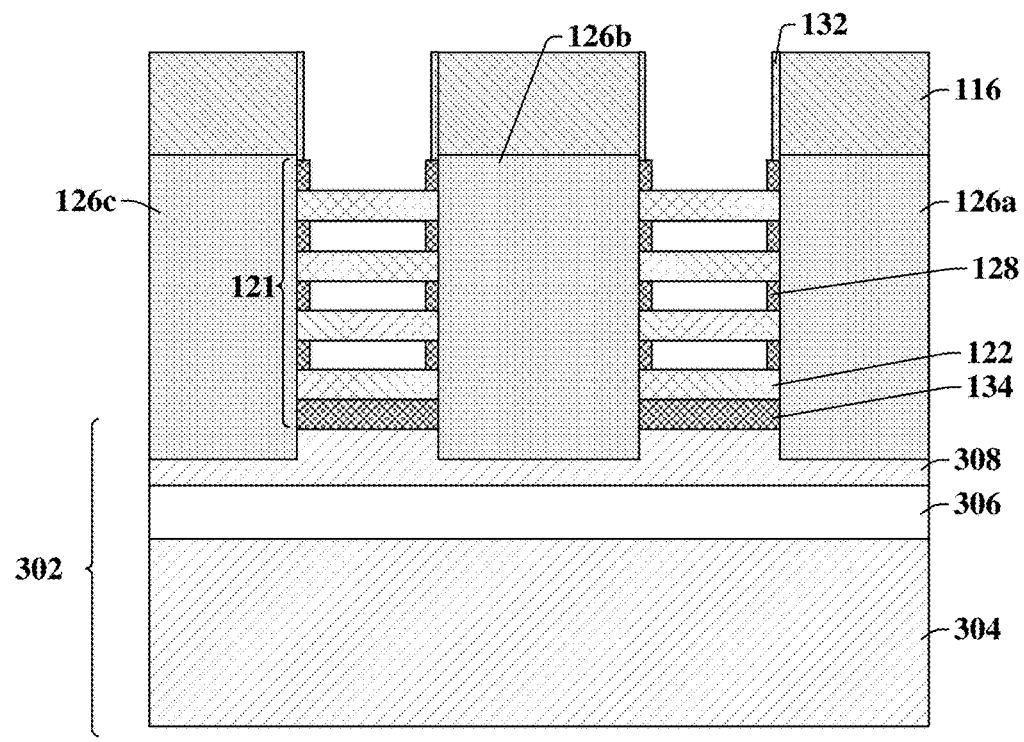

As shown in cross-sectional view 1100 of FIG. 11, in some embodiments, a gate dielectric layer 116 is formed over the first, second, and third source/drain regions 126a, 126b, 126c; and a removal process is conducted to remove the first and second dummy gate structures (502, 504 of FIG. 10) and the spacer layers (406 of FIG. 10). In some embodiments, the gate dielectric layer 116 is formed by way of a deposition process (e.g., PVD, CVD, PE-CVD, ALD, etc.). Further in some embodiments, the gate dielectric layer 116 comprises, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or some other suitable dielectric material.

In some embodiments, the removal process of FIG. 11 comprises one or more etching processes. For example, in some embodiments, a first etchant may be used to remove the dummy masking structures (508 of FIG. 10), and a second etchant may be used to remove the dummy gate electrodes (510 of FIG. 10), the dummy interfacial layer (506 of FIG. 10), and the spacer layers (406 of FIG. 10). In some embodiments, the removal process of FIG. 11 does not remove the first gate sidewall structure 132.

Figure 12:
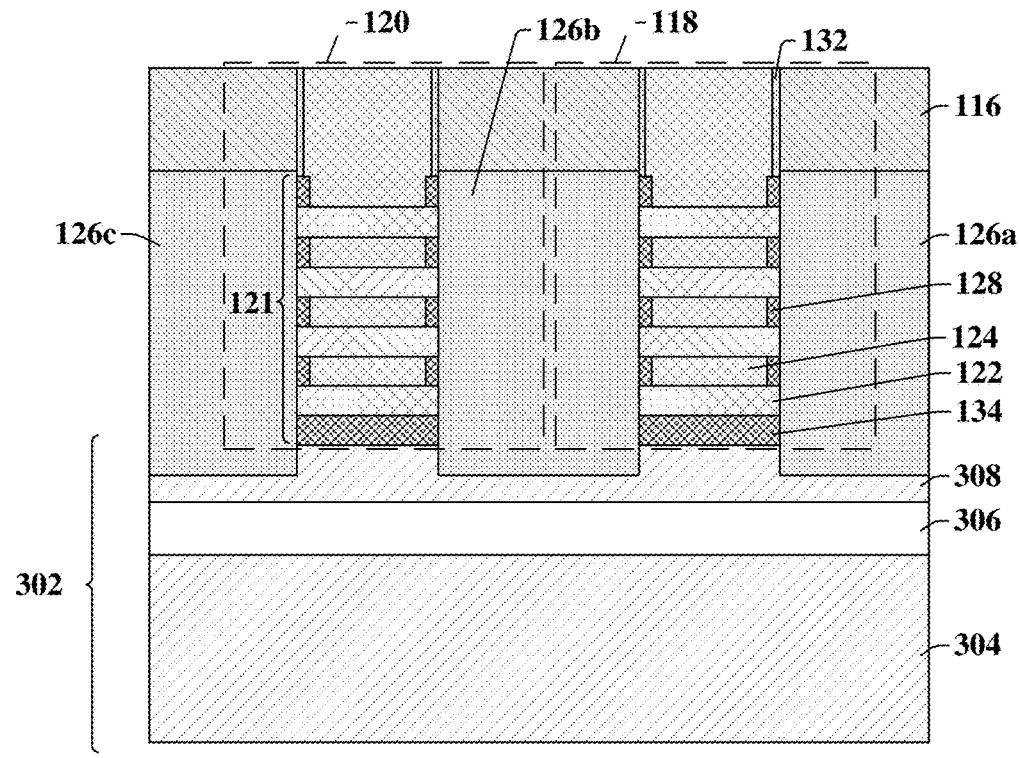

As shown in cross-sectional view 1200 of FIG. 12, in some embodiments, gate electrodes 124 are formed over and between the nanosheet channel structures 122, thereby forming a first nanosheet field effect transistor (NSFET) 118 and a second NSFET 120 arranged over the first substrate 302. In such embodiments, the second source/drain region 126b is arranged between and shared by the first and second NSFETs 118, 120.

It will be appreciated that in other embodiments, the steps of the method illustrated in FIGS. 3-12 may be modified to form some other transistor type than an NSFET, such as, for example, a fin field effect transistor.

In some embodiments, the gate electrodes 124 of the first and second NSFETs 118, 120 are formed by depositing a gate electrode material over and between the nanosheet channel structures 122. In some embodiments, the gate electrode material is formed by way of a deposition process (e.g., PVD, CVD, PE-CVD, ALD, sputtering, etc.). Further, in some embodiments, a removal process (e.g., chemical mechanical planarization (CMP)) is performed to remove any excess gate electrode material arranged over the gate dielectric layer 116 to form the gate electrode 124 of the first NSFET 118 and the gate electrode 124 of the second NSFET 120. In some embodiments, the gate electrodes 124 of the first and second NSFETs 118, 120 comprise a conductive material, such as, for example, titanium, tantalum, aluminum, or some other suitable conductive material.

Figure 13:
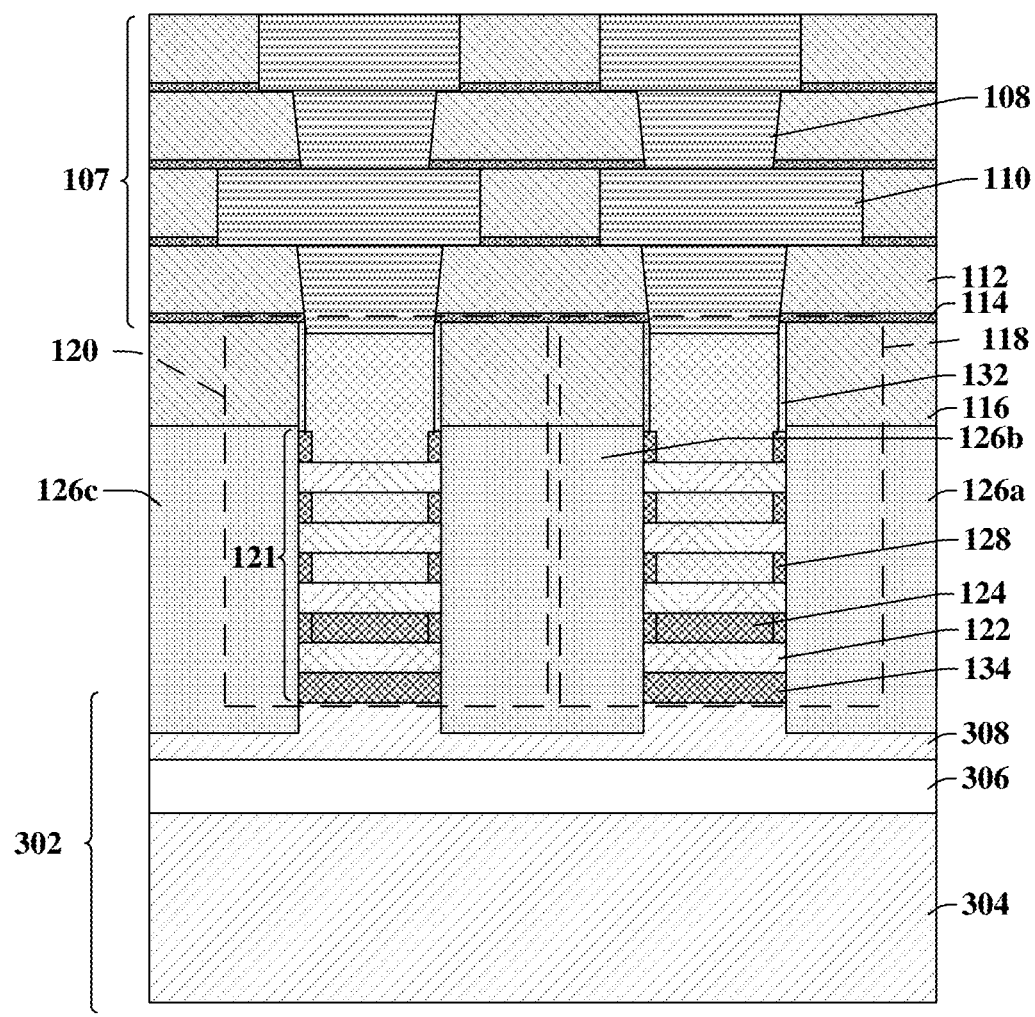

As shown in cross-sectional view 1300 of FIG. 13, a first interconnect structure 107 is formed over the gate electrodes 124 of the first and second NSFETs 118, 120 and over the gate dielectric layer 116. In some embodiments, the first interconnect structure 107 comprises interconnect vias 108 and interconnect wires 110 embedded in interconnect dielectric layers 112 and interconnect etch stop layers 114. In some embodiments, the first interconnect structure 107 may be formed by way of deposition processes (e.g., PVD, CVD, PE-CVD, ALD, sputtering, etc.), patterning processes (e.g., photolithography/etching), and removal processes (e.g., wet etching, dry etching, chemical mechanical planarization (CMP), etc.).

For example, in some embodiments a bottommost one of the interconnect etch stop layers 114 is deposited over the gate dielectric layer 116, and a bottommost one of the interconnect dielectric layers 112 is deposited over the bottommost one of the interconnect etch stop layers 114. Then, in some embodiments, photolithography is performed to form cavities in the bottommost ones of the interconnect dielectric layers 112 and the interconnect etch stop layers 114 to expose the gate electrodes 124 of the first and second NSFETs 118, 120. Then, in some embodiments, a conductive material may be deposited within the cavities, and a removal process is performed to remove excess conductive material arranged over the bottommost one of the interconnect dielectric layers 112 to form the interconnect vias 108 in the bottommost ones of the interconnect dielectric layers 112 and the interconnect etch stop layers 114. In such embodiments, the interconnect vias 108 and/or the interconnect wires 110 may be formed by way of a damascene process or a dual-damascene process. In some other embodiments, it will be appreciated that more or less than the interconnect wires 110 and interconnect vias 108 may be present than what is illustrated in the cross-sectional view 1300 of FIG. 13.

In some embodiments, the interconnect dielectric layers 112 comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or some other suitable dielectric material. In some embodiments, the interconnect etch stop layers 114 also comprise a dielectric material, but comprise a different dielectric material than the interconnect dielectric layers 112. In some embodiments, the interconnect wires 110 and the interconnect vias 108 comprise a conductive material such as, for example, tungsten, aluminum, copper, titanium, tantalum, or some other suitable conductive material.

Figure 14:
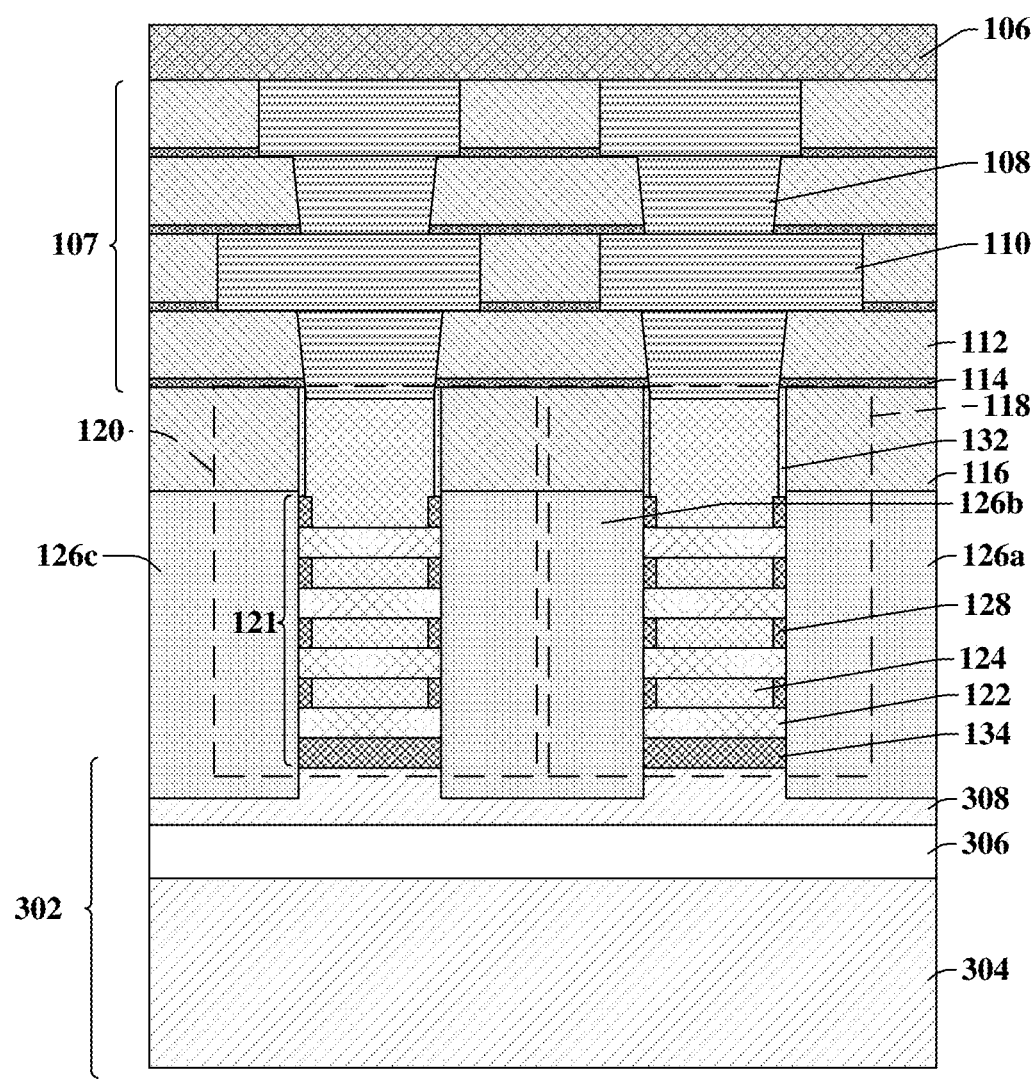

As shown in cross-sectional view 1400 of FIG. 14, in some embodiments, a second bonding layer 106 is formed over the first interconnect structure 107. In some embodiments, the second bonding layer 106 comprises, for example, an oxide such as silicon dioxide. It will be appreciated that other materials for the second bonding layer 106 are also within the scope of the disclosure. In some embodiments, the second bonding layer 106 is formed by way of a high density plasma deposition process. In other embodiments, the second bonding layer 106 may be formed by way of another deposition process (e.g., CVD, PVD, PE-CVD, ALD, etc.). In some embodiments, to ensure a smooth upper surface, for example, the second bonding layer 106 may undergo a CMP process after it is deposited over the first interconnect structure 107.

Figure 15:
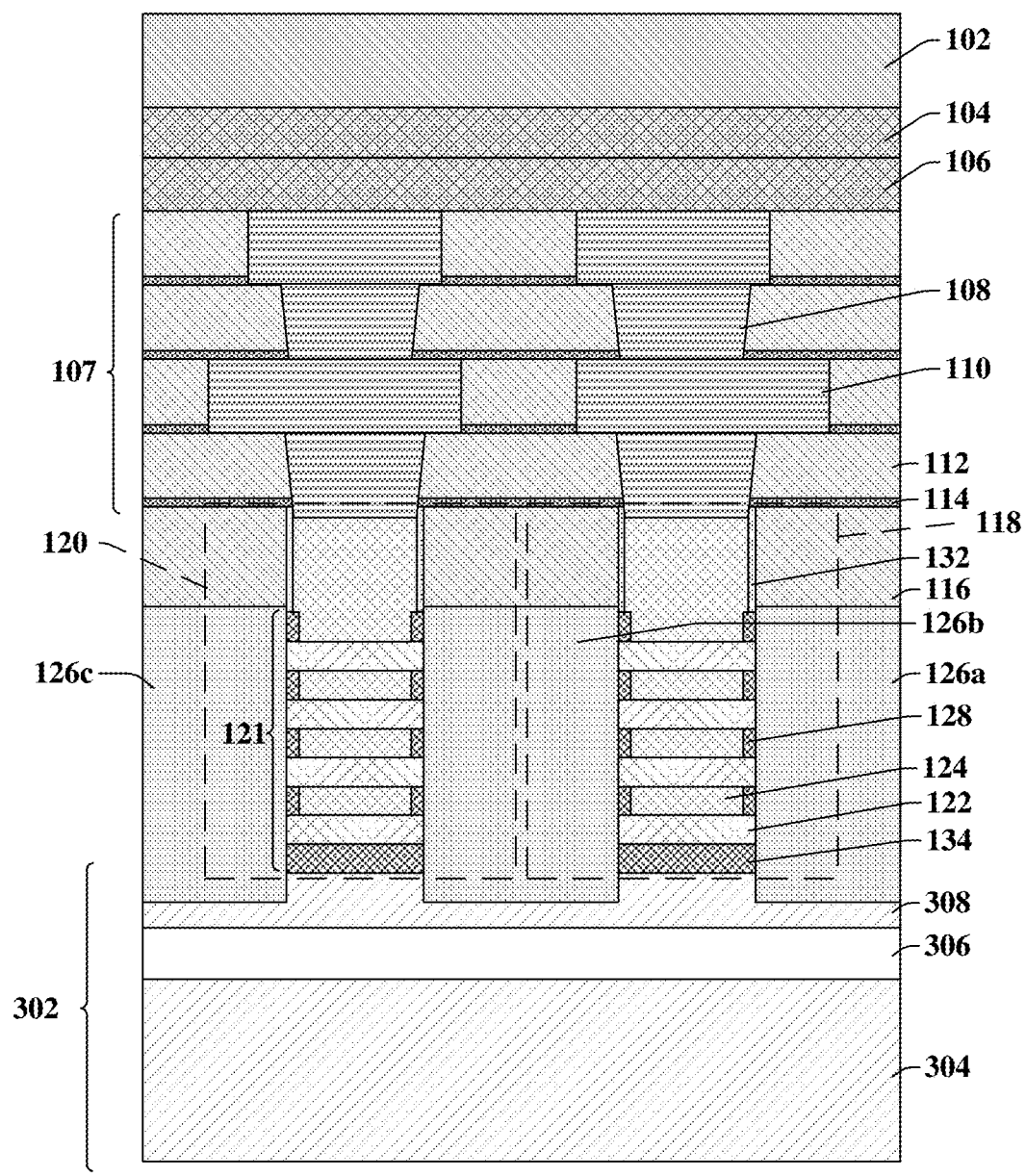

As shown in cross-sectional view 1500 of FIG. 15, in some embodiments, a first bonding layer 104 arranged on a carrier substrate 102 is bonded to the second bonding layer 106. In such embodiments, the bonding process to bond the first bonding layer 104 to the second bonding layer 106 may comprise a thermal bonding process, for example. It will be appreciated that other bonding processes are also within the scope of the disclosure. It some embodiments, the first bonding layer 104 may also comprise an oxide, such as, silicon dioxide, for example.

Figure 16:
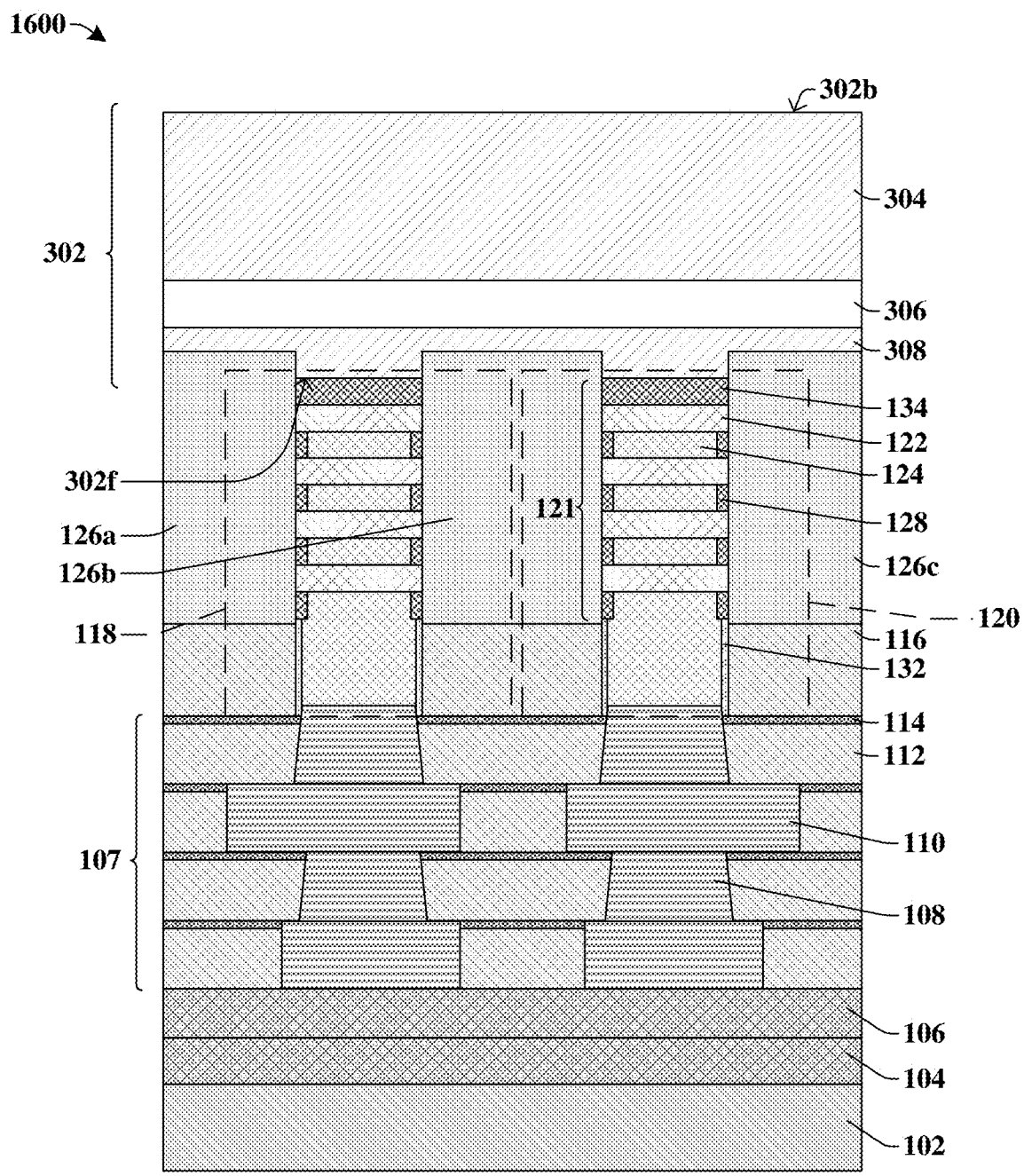

As shown in cross-sectional view 1600 of FIG. 16, in some embodiments, the structure in the cross-sectional view 1500 of FIG. 15 is flipped such that a backside 302*b* of the first substrate 302 is facing "up" to be patterned. It will be appreciated that in FIGS. 3-15, the first and second NSFETs 118, 120 were formed on a frontside 302*f* of the first substrate 302 and that the frontside 302*f* of the first substrate 302 is on an opposite side of the backside 302*b* of the first substrate 302. In embodiments wherein the first substrate 302 is an SOI substrate, the first substrate 302 is flipped such that the base layer 304 is exposed for patterning. In such embodiments, the carrier substrate 102 may protect the first interconnect structure 107 from damage during the flipping of the structure in FIG. 16.

Figure 17:
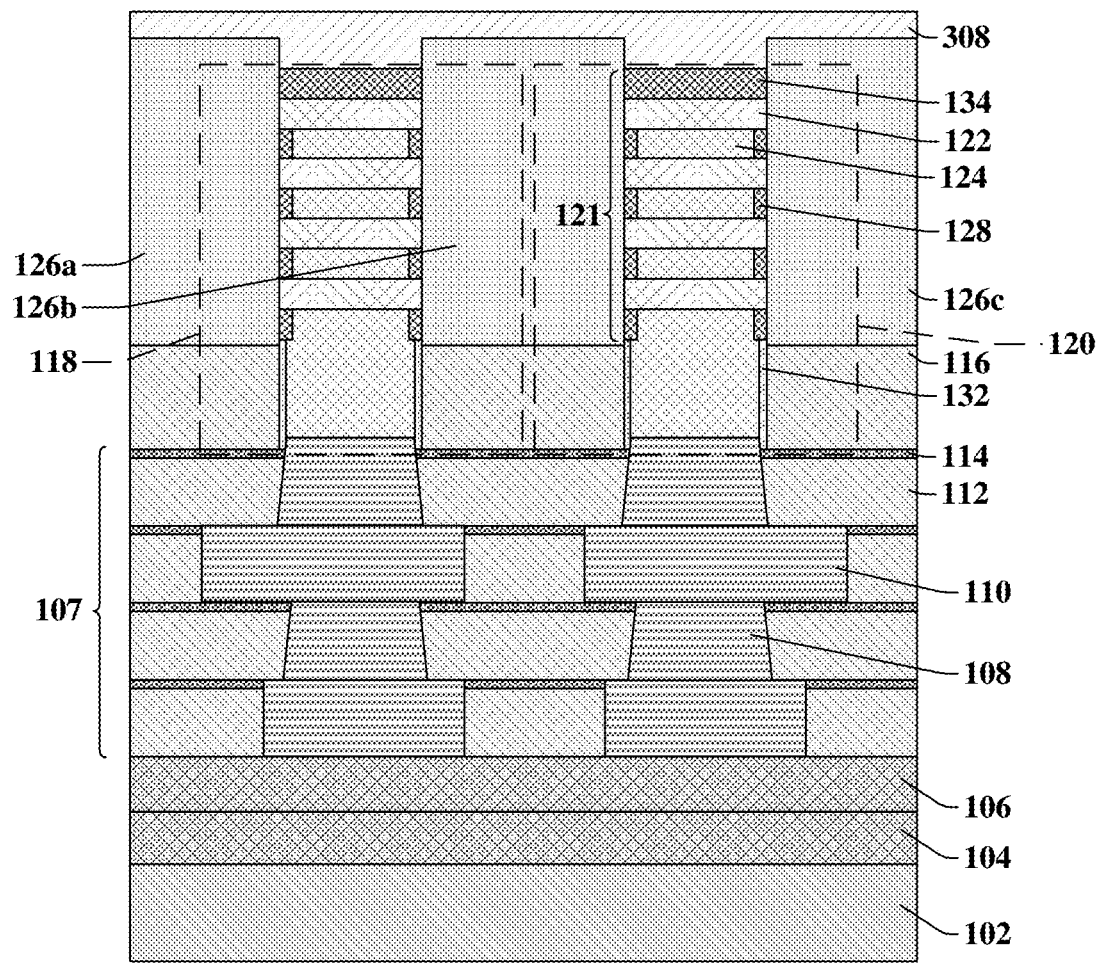

As shown in cross-sectional view 1700 of FIG. 17, in some embodiments, a removal process is performed to remove portions of the first substrate (302 of FIG. 17). In some embodiments, the removal process may comprise a CMP process to thin down the first substrate (302 of FIG. 17). The removal process of FIG. 17 may be conducted to remove the base layer (304 of FIG. 16) of the first substrate (302 of FIG. 16) and the insulator layer (306 of FIG. 16) of the first substrate (302 of FIG. 16). In some embodiments, the removal process of FIG. 17 is stopped before completely removing the active layer 308. Thus, after the removal process of FIG. 17, in some embodiments, the active layer 308 may still completely cover the first, second, and third source/drain regions 126*a*, 126*b*, 126*c*. In other embodiments, the removal process of FIG. 17 may comprise an etching process.

Figure 18:
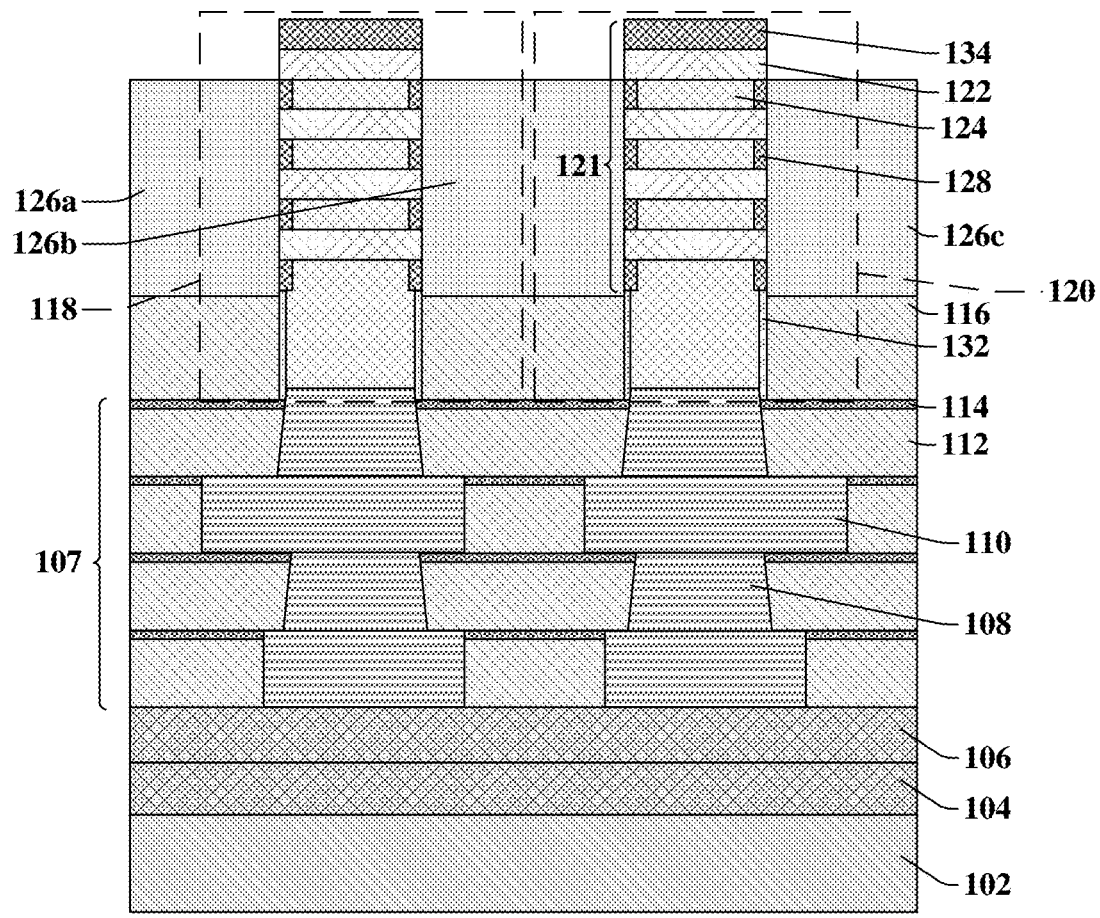

As shown in cross-sectional view 1800 of FIG. 18, in some embodiments, a removal process is performed to completely remove the active layer (308 of FIG. 17) and/or remaining portions of the first substrate (302 of FIG. 16) from the first, second, and third source/drain regions 126*a*, 126*b*, 126*c*. In some embodiments, the removal process of FIG. 18 comprises an etching process (e.g., wet etching, dry etching). In some embodiments, the removal processes of FIGS. 17 and 18 comprise a single etchant, whereas in other embodiments, the removal process of FIG. 17 comprises a CMP process followed by an etching process in FIG. 18. In some embodiments, the removal process of FIG. 18 also removes upper portions of the first, second, and third source/drain regions 126*a*, 126*b*, 126*c*. In some embodiments, a same etchant may be used to remove the first substrate (302 of FIG. 16) and portions of the first, second, and third source/drain regions 126*a*, 126*b*, 126*c*, whereas in other embodiments different etchants may be used to remove the first substrate (302 of FIG. 16) and the portions of the first, second, and third source/drain regions 126*a*, 126*b*, 126*c*.

Nevertheless, in such embodiments, after the removal process of FIG. 18, one or more of the nanosheet channel structures 122 may be exposed. In such embodiments, the protection layers 134 of the first and second NSFETs 118, 120 provide protection to the nanosheet channel structures 122 during the removal of the first substrate (302 of FIG. 16). Thus, in some embodiments, the removal process of FIG. 18 comprises one or more etchants to remove the first substrate (302 of FIG. 16) and portions of the first, second, and third source/drain regions 126*a*, 126*b*, 126*c*, and the protection layers 134 comprise a material that is resistant to removal by the one or more etchants of the removal process of FIG. 18. Further, the one or more etchants of the removal process of FIG. 18 may be performed in a substantially vertical direction to prevent removal or damage to the nanosheet channel structures 122 in the lateral direction.

Figure 19:
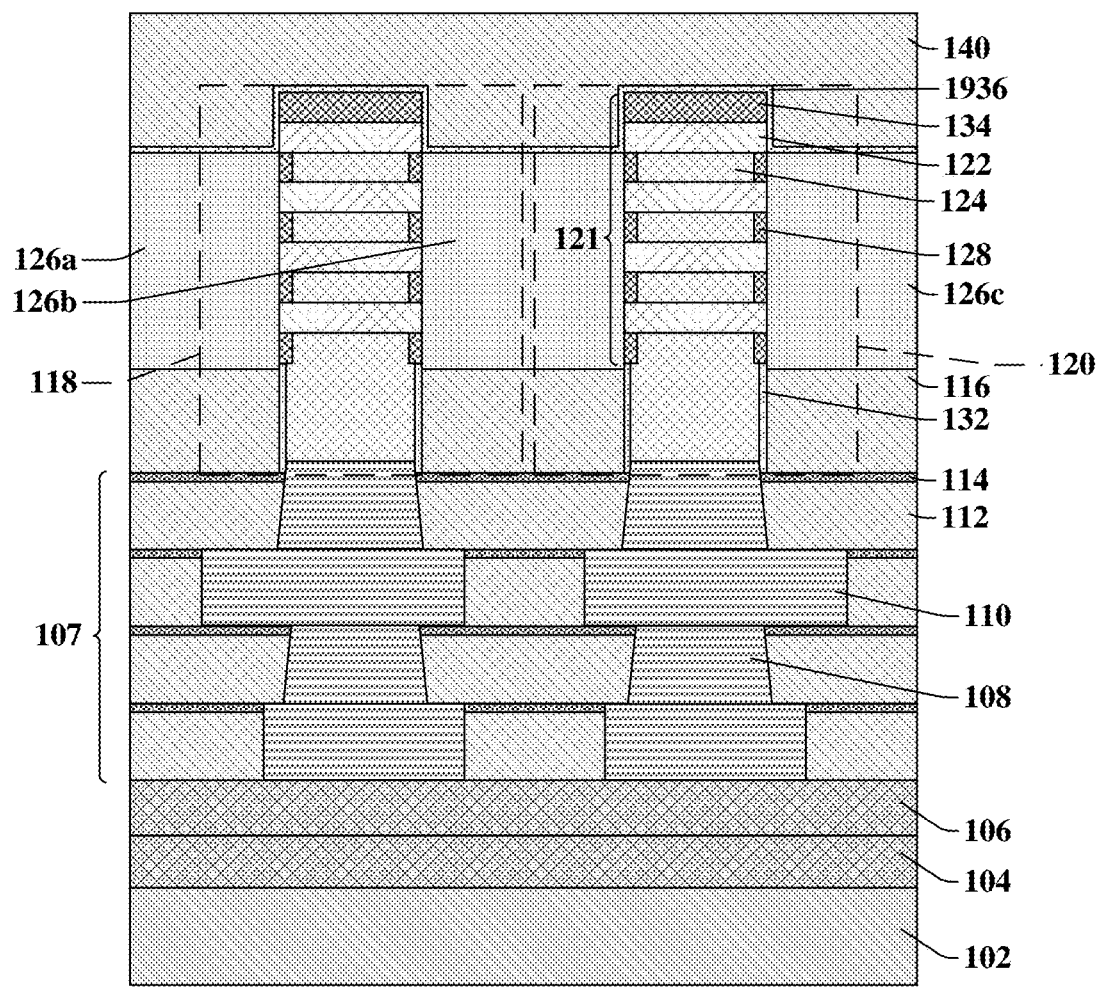

As shown in cross-sectional view 1900 of FIG. 19, in some embodiments, a barrier layer 1936 may be formed continuously over the first and second NSFETs 118, 120, thereby covering outer sidewalls of the nanosheet channel structures 122 arranged over the first, second, and third source/drain regions 126*a*, 126*b*, 126*c*. In some embodiments, the barrier layer 1936 is formed by way of a deposition process (e.g., PVD, CVD, PE-CVD, ALD, etc.) and comprises a carbide (e.g., silicon carbide), a nitride (e.g., silicon nitride, silicon carbon nitride), or some other suitable dielectric material.

Further, in some embodiments, a contact dielectric layer 140 is formed over the barrier layer 1936. In some embodiments, the contact dielectric layer 140 is formed by way of a deposition process (e.g., PVD, CVD, PE-CVD, ALD, etc.) and/or a removal process (e.g., etching, CMP, etc.). In some embodiments, the contact dielectric layer 140 comprises, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or some other suitable dielectric material. In some embodiments, the contact dielectric layer 140 extends above the first and second NSFETs 118, 120.

Figure 20:
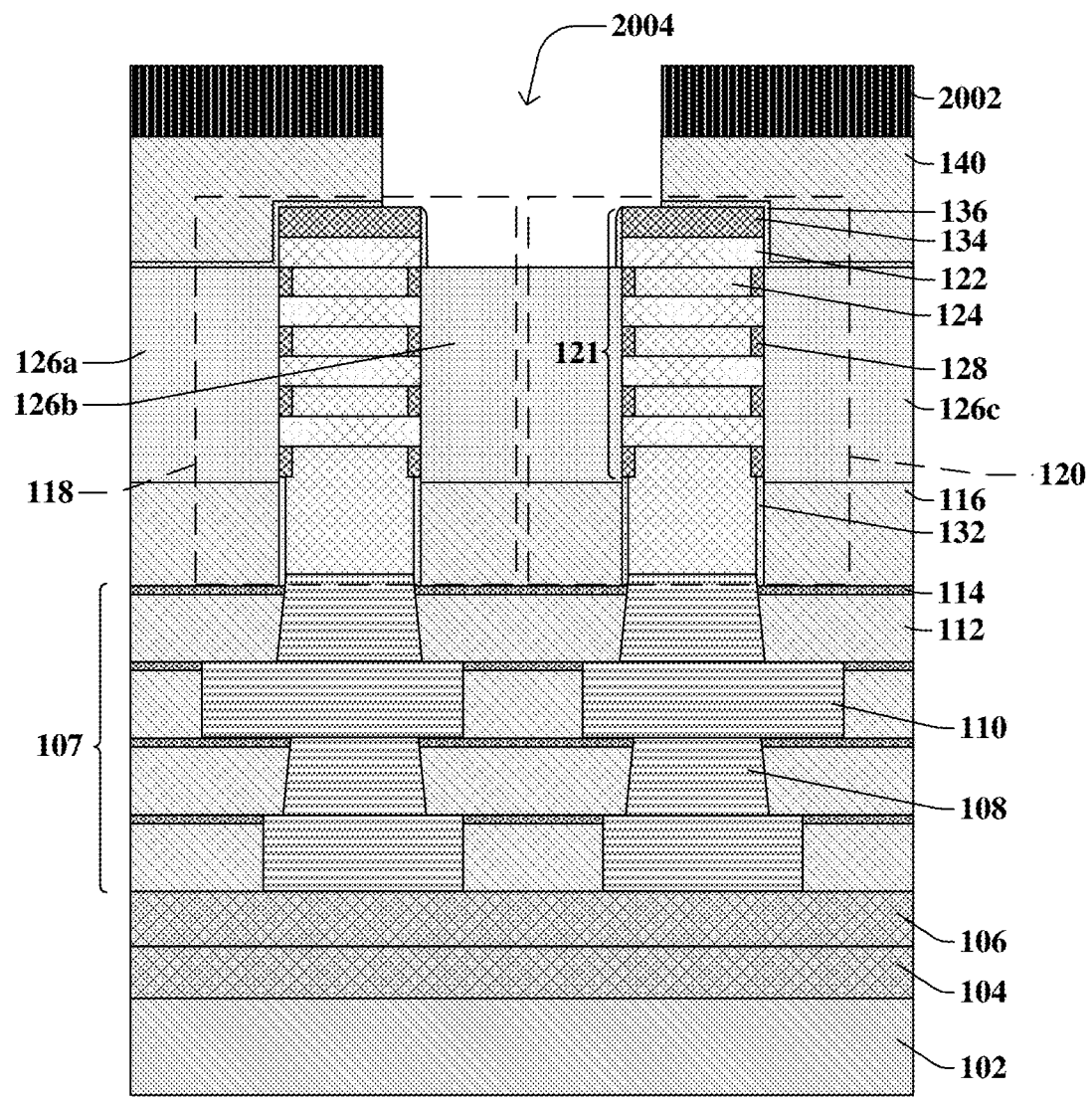

As shown in cross-sectional view 2000 of FIG. 20, in some embodiments, a contact masking structure 2002 is formed over the contact dielectric layer 140, and a removal process is performed according to the contact masking structure 2002 to form a contact cavity in the contact dielectric layer 140. In some embodiments, the contact masking structure 2002 is formed by way of photolithography and removal (e.g., etching) processes to form an opening arranged over the second source/drain region 126*b*. In such embodiments, the contact masking structure 2002 may comprise a photoresist or a hard mask material. In some embodiments, after the formation of the contact masking structure 2002, the removal process of FIG. 20 is performed to remove portions of the contact dielectric layer 140 directly underlying the opening in the contact masking structure 2002 to form the contact cavity 2004. In some embodiments, the removal process of FIG. 20 comprises an etching process (e.g., wet etching, dry etching). In some embodiments, the contact cavity 2004 exposes the entire upper surface of the second source/drain region 126*b*. Further, in some embodiments, portions of the protection layers 134 are also exposed after the formation of the contact cavity 2004. In such embodiments, the protection layers 134 may comprise a material that is substantially resistant to removal by the removal process of FIG. 20.

Further, in some embodiments, horizontal portions of the barrier layer (1934 of FIG. 19) that are arranged directly below the opening in the contact masking structure 2002 may be removed by the removal process of FIG. 20. The remaining barrier layer (1934 of FIG. 19) may form a barrier structure 136 arranged on outer sidewalls of the protection layers 134 and nanosheet channel structures 122 arranged above the first, second, and third source/drain regions 126*a*, 126*b*, 126*c*. The barrier structure 136 may protect the nanosheet channel structures 122 from removal and/or damage by the removal process of FIG. 20.

Figure 21:
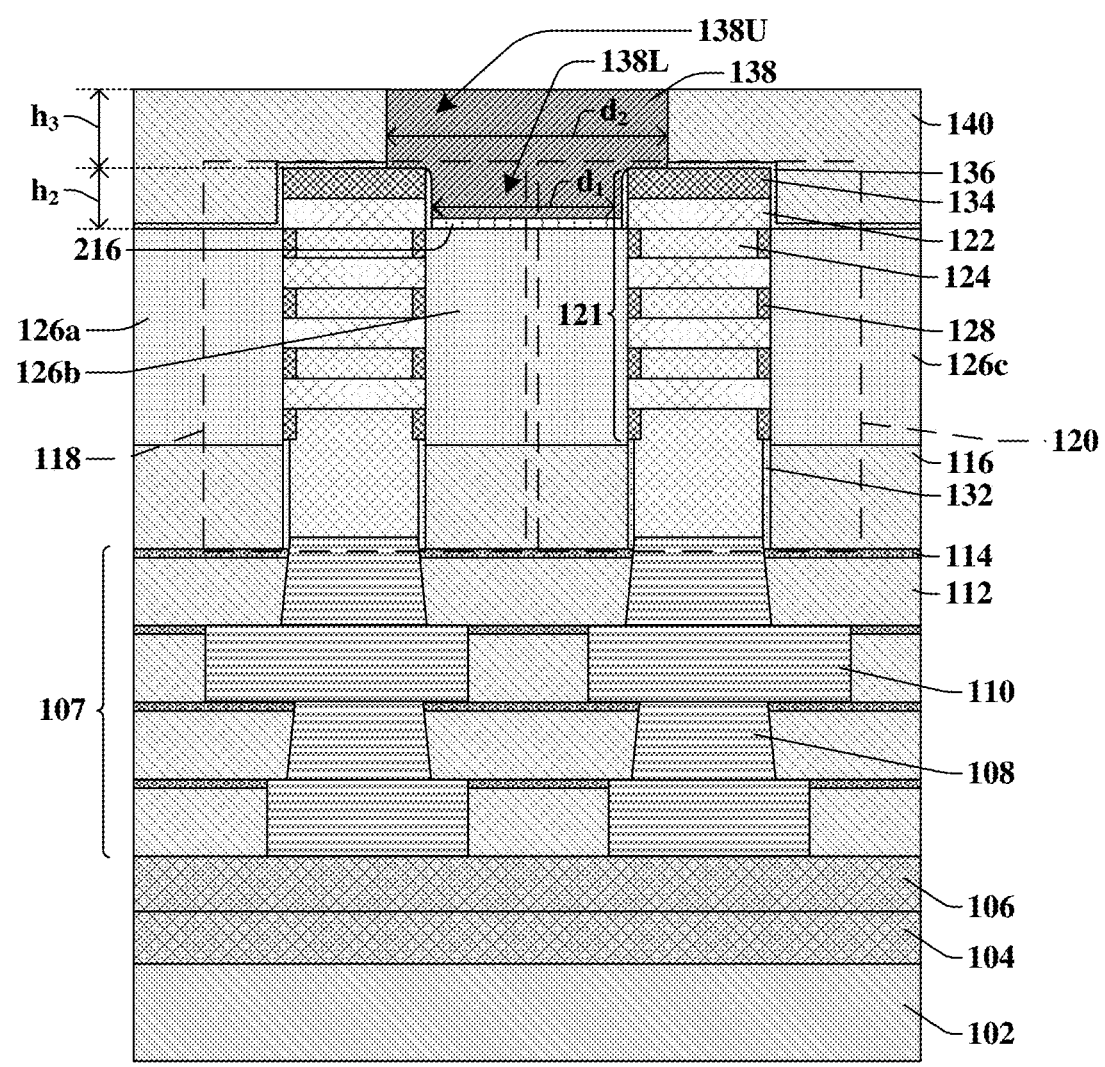

As shown in cross-sectional view 2100 of FIG. 21, a silicide layer 216 may be formed over the second source/drain region 126*b*, and a contact plug structure 138 may be formed over the silicide layer 216 and within the contact cavity (2004 of FIG. 20). In some embodiments, the silicide layer 216 may be formed by depositing a transition metal layer covering the second source/drain region 126b and subsequently heating the transition metal layer so it reacts with the semiconductor material of the second source/drain region 126b. Thus, in some embodiments, the silicide layer 216 may comprise nickel silicide, titanium silicide, cobalt silicide, platinum silicide, tungsten silicide, or some other metal-semiconductor material.

In some embodiments, after the formation of the silicide layer 216, a contact conductive material is formed over the silicide layer 216 by way of a deposition process (e.g., CVD, PVD, PE-CVD, ALD, sputtering, etc.). In some embodiments, excess contact conductive material arranged over the contact dielectric layer 140 is then removed by way of a removal process (e.g., etching, CMP) to form the contact plug structure 138 embedded in the contact dielectric layer 140. In some embodiments, the contact plug structure 138 may comprise, for example, tungsten, ruthenium, cobalt, or some other conductive material with a low resistivity. Further, in some embodiments, the contact plug structure 138 comprises a lower portion 138L arranged directly between the protection layers 134 that has a width equal to the first distance $d_1$ and second height $h_2$. In some embodiments, the first distance $d_1$ may be in a range of between, for example, approximately 2.5 nanometers and approximately 100 nanometers, and the second height $h_2$ may be in a range of between, for example, approximately 5 nanometers and approximately 150 nanometers. Further, in some embodiments, the contact plug structure 138 comprises an upper portion 138U arranged over the protection layers 134 that has a width equal to a second distance $d_2$ and a third height $h_3$. In some embodiments, the second distance $d_2$ and the third height $h_3$ may each be in a range of between, for example approximately 5 nanometers and approximately 150 nanometers.

Figure 22:
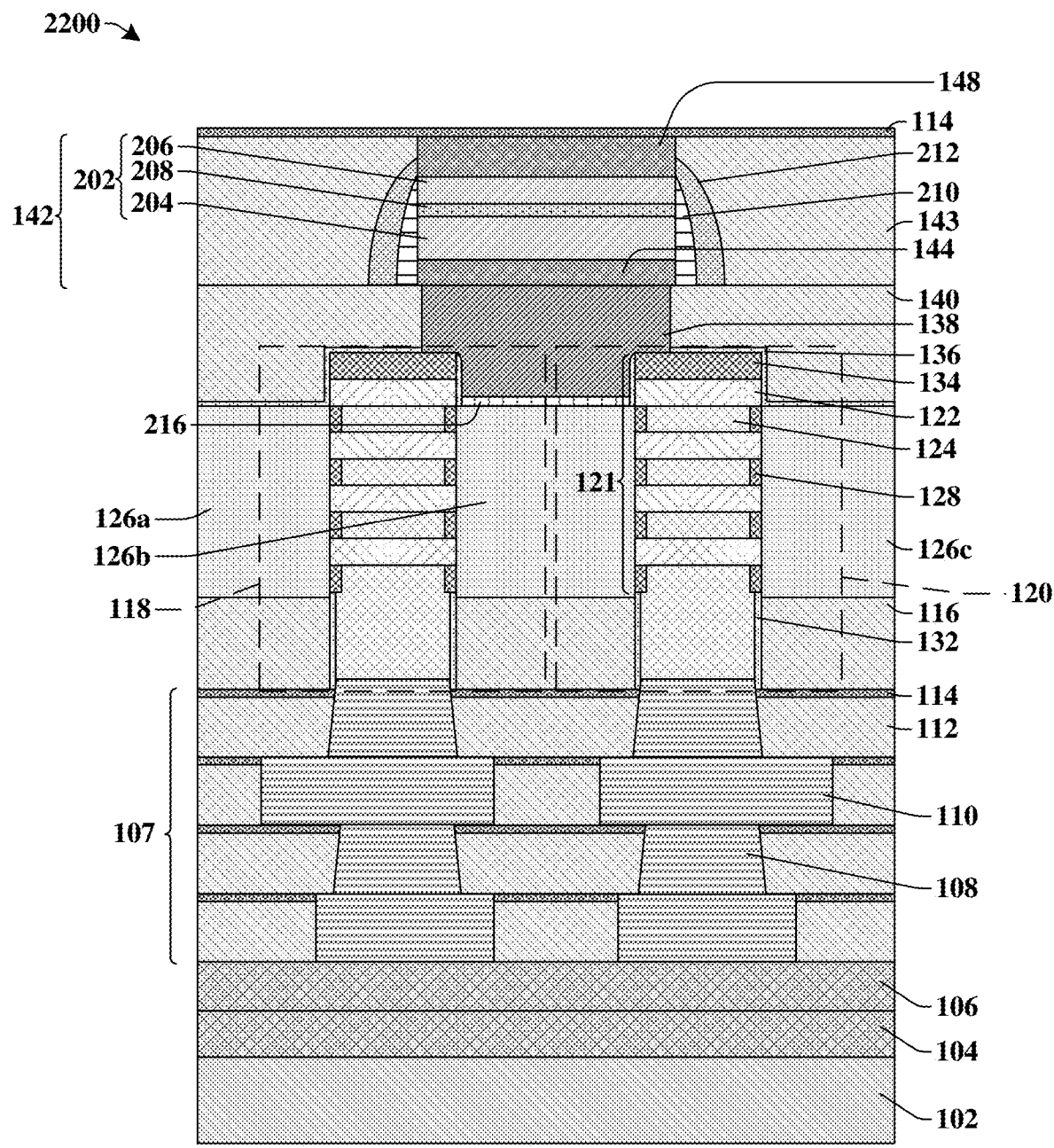

As shown in cross-sectional view 2200 of FIG. 22, in some embodiments, a memory structure 142 is formed directly over the contact plug structure 138. In some embodiments, the memory structure 142 is a magnetoresistive random-access memory (MRAM) cell, comprising a magnetic tunnel junction (MTJ) stack 202 arranged between a top electrode 148 and a bottom electrode 144. The bottom electrode 144 is arranged directly over and is coupled to the contact plug structure 138. In some embodiments, the MTJ stack 202 may comprise a thin insulating layer 208 arranged between a bottom magnetic layer 204 and a top magnetic layer 206. Further in some embodiments, the MTJ stack 202 has outermost sidewalls surrounded by a first MRAM sidewall structure 210 and a second MRAM sidewall structure 212. The memory structure 142 may be arranged within a memory dielectric structure 143 arranged over the contact dielectric layer 140.

In some embodiments, the memory structure 142 is formed through various steps comprising deposition processes (e.g., physical vapor deposition (PVD), chemical vapor deposition (CVD), PE-CVD, atomic layer deposition (ALD), sputtering, etc.), removal processes (e.g., wet etching, dry etching, chemical mechanical planarization (CMP), etc.), and/or patterning processes (e.g., photolithography/etching). In other embodiments, the memory structure 142 may instead be or comprise a metal-insulator-metal memory cell, a ferroelectric random-access memory cell, a phase-change random-access memory cell, a resistive random-access memory cell, or some other memory device. In some embodiments, an interconnect etch stop layer 114 is formed over the memory structure 142 for protection of the memory structure 142 and/or memory dielectric structure 143 in future processing steps.

Figure 23:
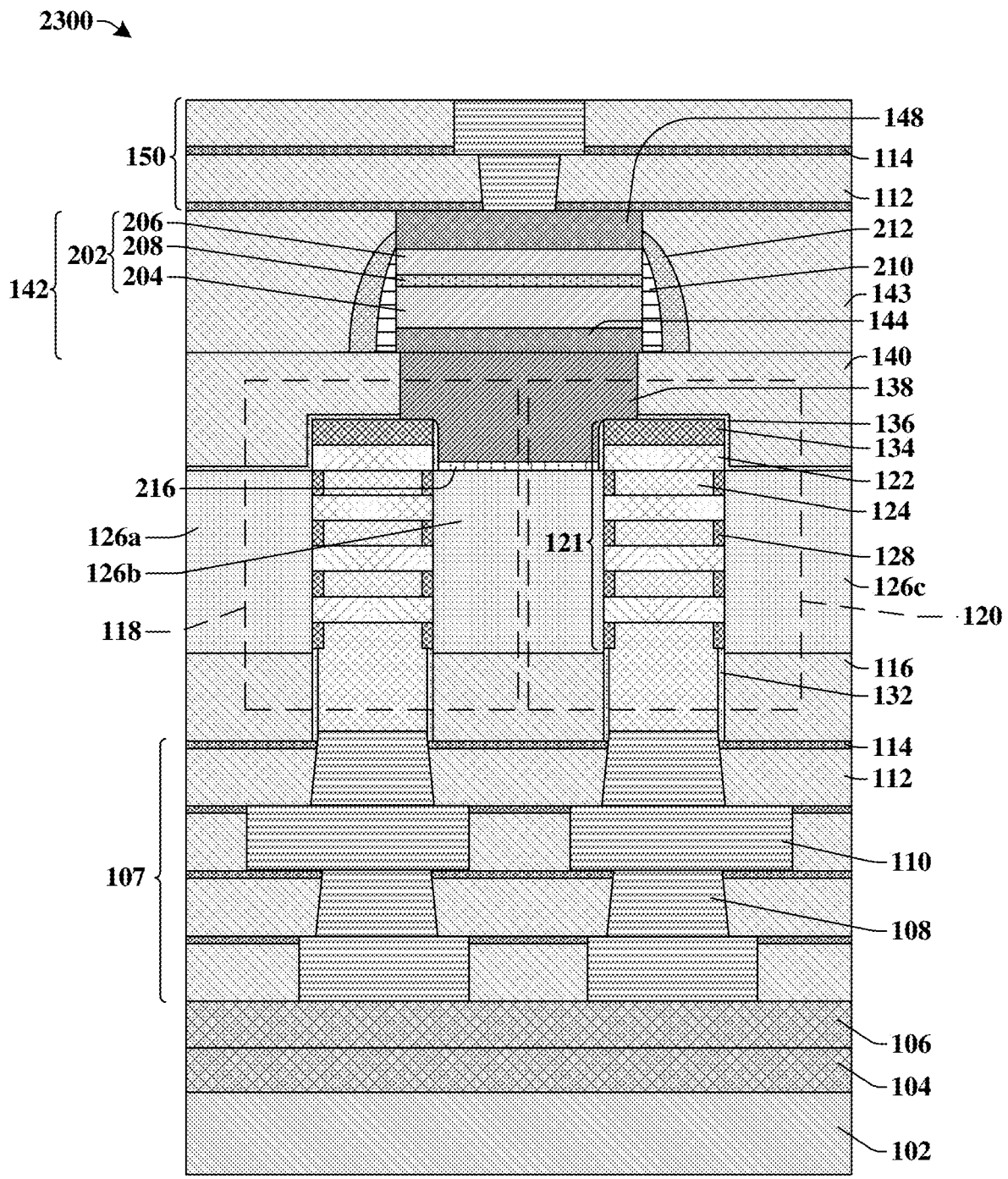

As shown in cross-sectional view 2300 of FIG. 23, in some embodiments, a second interconnect structure 150 is arranged over and coupled to the memory structure 142. In some embodiments, the second interconnect structure 150 is formed similarly to the first interconnect structure 107 as described in FIG. 13. The second interconnect structure 150 may comprise interconnect vias 108 and interconnect wires 110 embedded in interconnect dielectric layers 112 and/or interconnect etch stop layers 114. In some embodiments, from the perspective of the cross-sectional view 2300, wherein the second interconnect structure 150 is arranged over the first and second NSFETs 118, 120, and the first interconnect structure 107 is arranged below the first and second NSFETs 118, 120, the interconnect vias 108 of the second interconnect structure 150 have upper surfaces wider than their lower surfaces, whereas the interconnect vias 108 of the first interconnect structure 107 have upper surfaces that are more narrow than their lower surfaces.

In the cross-sectional view 2300 of FIG. 23, the memory structure 142 is arranged over and coupled to the first and second NSFETs 118, 120 through the contact plug structure 138, and a first interconnect structure 107 is arranged below and coupled to the first and second NSFETs 118, 120. Because upper and lower sides of the first and second NSFETs 118, 120 are utilized, the overall height of the integrated chip may be reduced to increase device density while also improving signal travel efficiency between the first and second NSFETs 118, 120 and the memory structure 142 to increase device reliability.

Figure 24:
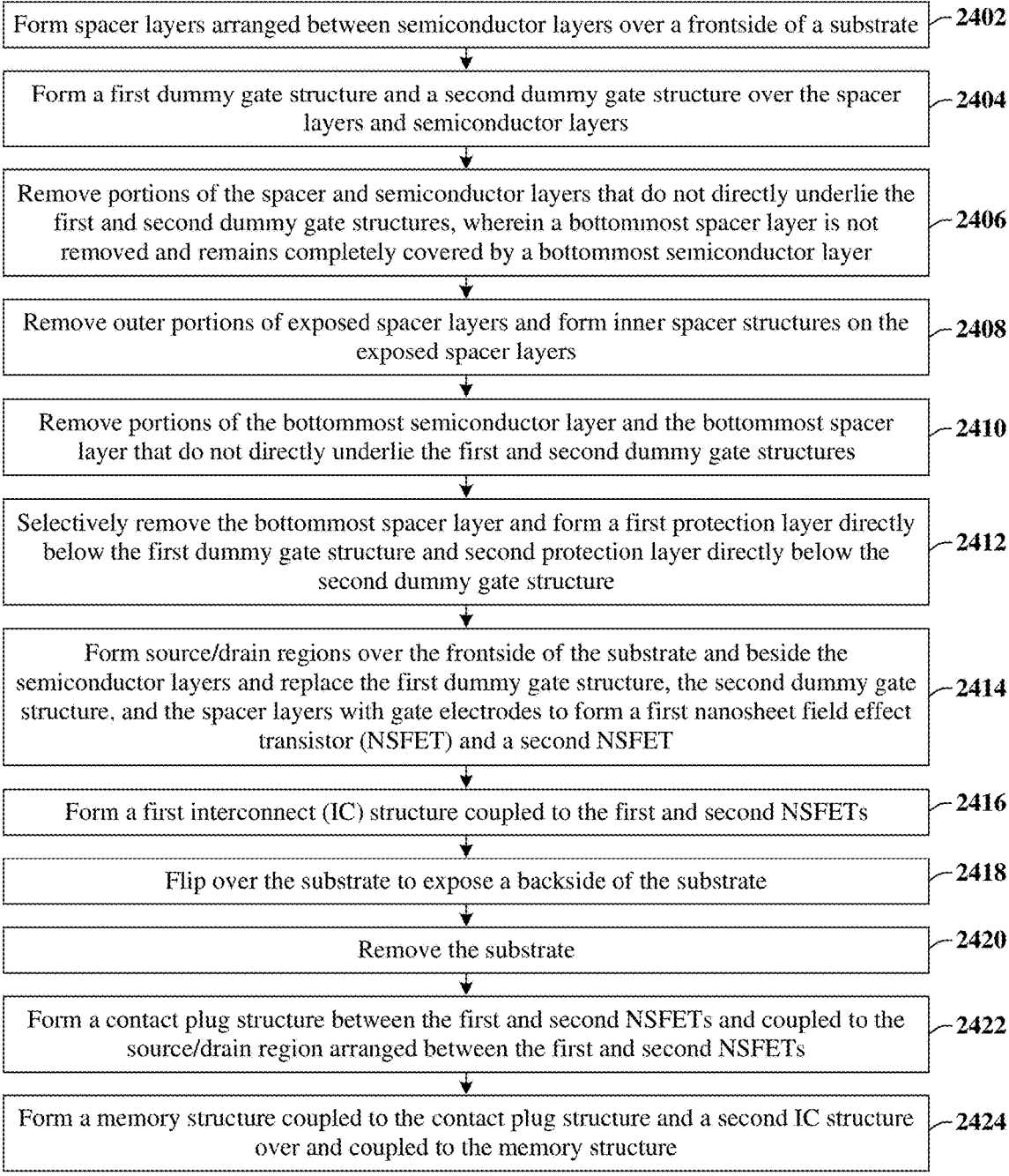
FIG. 24 illustrates a flow diagram of some embodiments of the method illustrated in FIGS. 3-23.

FIG. 24 illustrates a flow diagram of some embodiments of a method 2400 corresponding to the method illustrated in FIGS. 3-23.

While method 2400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2402, spacer layers arranged between semiconductor layers are formed over a frontside of a substrate. FIG. 4 illustrates a cross-sectional view 400 of some embodiments corresponding to act 2402.

At act 2404, a first dummy gate structure and a second dummy gate structure are formed over the spacer and semiconductor layers. FIG. 5 illustrates cross-sectional view 500 of some embodiments corresponding to act 2404.

At act 2406, portions of the spacer and semiconductor layers that do not directly underlie the first and second dummy gate structures are removed, wherein a bottommost spacer layer is not removed and remains completely covered by a bottommost semiconductor layer. FIG. 6 illustrates cross-sectional view 600 of some embodiments corresponding to act 2406.

At act 2408, outer portions of exposed spacer layers are removed, and inner spacer structures are formed on the exposed spacer layers. FIG. 7 illustrates cross-sectional view 700 of some embodiments corresponding to act 2408.

At act 2410, portions of the bottommost semiconductor layer and the bottommost spacer layer that do not directly underlie the first and second dummy gate structures are removed. FIG. 8 illustrates cross-sectional view 800 of some embodiments corresponding to act 2410.

At act 2412, the bottommost semiconductor layer is selectively removed, and a first protection layer and a second protection layer arranged directly below the first dummy gate structure and the second dummy gate structure, respectively, are formed. FIG. 9 illustrates cross-sectional view 900 of some embodiments corresponding to act 2412.

At act 2414, source/drain regions are formed over the frontside of the substrate and beside the semiconductor layers; and the first dummy gate structure, the second dummy gate structure, and the spacer layers are replaced with gate electrodes to form a first nanosheet field effect transistor (NSFET) and a second NSFET. FIGS. 10, 11, and 12 illustrate cross-sectional views 1000, 1100, 1200, respectively, of some embodiments corresponding to act 2414.

At act 2416, a first interconnect (IC) structure that is coupled to the first and second NSFETs is formed. FIG. 13 illustrates cross-sectional view 1300 of some embodiments corresponding to act 2416.

At act 2418, the substrate is flipped over to expose a backside of the substrate. FIG. 16 illustrates cross-sectional view 1600 of some embodiments corresponding to act 2418.

At act 2420, the substrate is removed. FIGS. 17 and 18 respectively illustrate cross-sectional views 1700 and 1800 of some embodiments corresponding to act 2420.

At act 2422, a contact plug structure is formed between the first and second NSFETs and is coupled to the source/drain region arranged between the first and second NSFETs. FIG. 21 illustrates cross-sectional view 2100 of some embodiments corresponding to act 2422.

At act 2424, a memory structure is formed over and coupled to the contact plug structure, and a second IC structure is formed over and coupled to the memory structure. FIGS. 22 and 23 respectively illustrate cross-sectional views 2200 and 2300 of some embodiments corresponding to act 2424.

Therefore, the present disclosure relates to a method of manufacturing a memory structure arranged over first and second transistors and a first interconnect structure arranged below the first and second transistors to reduce the height of the integrated chip to increase device density while also improving signal travel efficiency.

Accordingly, in some embodiments, the present disclosure relates to an integrated chip comprising: a first transistor arranged over a substrate and comprising: first channel structures extending between a first source/drain region and a second source/drain region, a first gate electrode arranged between the first channel structures, and a first protection layer arranged over a topmost one of the first channel structures; a second transistor arranged over the substrate, beside the first transistor, and comprising: second channel structures extending between the second source/drain region and a third source/drain region, a second gate electrode arranged between the second channel structures, and a second protection layer arranged over a topmost one of the second channel structures; a first interconnect structure coupled to the first and second gate electrodes and arranged between the substrate and the first and second channel structures; and a contact plug structure coupled to the second source/drain region and arranged above the first and second gate electrodes.

In other embodiments, the present disclosure relates to an integrated chip comprising: a first interconnect structure over a substrate; a first channel structure arranged over and coupled to the first interconnect structure; a second channel structure arranged over and coupled to the first interconnect structure; a source/drain region arranged between the first and second channel structures; a first protection layer and a second protection layer arranged over the first channel structure and the second channel structure, respectively; a contact plug structure arranged over and coupled to the source/drain region; and a memory structure arranged over and coupled to the contact plug structure.

In yet other embodiments, the present disclosure relates to a method comprising: forming a first protection layer over a first substrate and a second protection layer over the first substrate; forming a first nanosheet field effect transistor (NSFET) arranged over the first protection layer and comprising first nanosheet channel structures, a first source/drain region, a second source/drain region, and a first gate electrode; forming a second NSFET over the second protection layer and comprising second nanosheet channel structures, the second source/drain region, a third source/drain region, and a second gate electrode; forming a first interconnect structure over the first and second NSFETs, wherein the first interconnect structure comprises interconnect wires and interconnect vias embedded in an interconnect dielectric structure; forming a bonding layer over the first interconnect structure; bonding a carrier substrate to the bonding layer; flipping the first substrate over to pattern a backside of the first substrate; removing the first substrate completely to expose the first, second, and third source/drain regions and the first and second protection layers; forming a dielectric layer over the first, second, and third source/drain regions and the first and second protection layers; forming a contact plug structure extending through the dielectric layer and coupled to the second source/drain region that is arranged between the first and second NSFETs; forming a memory structure over and coupled to the contact plug structure; and forming a second interconnect structure over and coupled to the memory structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first protection layer over a first substrate and a second protection layer over the first substrate;
    forming a first nanosheet field effect transistor (NSFET) arranged over the first protection layer and comprising first nanosheet channel structures, a first source/drain region, a second source/drain region, and a first gate electrode;
    forming a second NSFET over the second protection layer and comprising second nanosheet channel structures, the second source/drain region, a third source/drain region, and a second gate electrode;
    forming a first interconnect structure over the first and second NSFETs, wherein the first interconnect structure comprises interconnect wires and interconnect vias embedded in an interconnect dielectric structure;
    forming a bonding layer over the first interconnect structure;
    bonding a carrier substrate to the bonding layer;

flipping the first substrate over to pattern a backside of the first substrate;
removing the first substrate completely to expose the first, second, and third source/drain regions and the first and second protection layers, wherein the first, second, and third source/drain regions overlie the first interconnect structure and have individual top surfaces elevated relative to individual top surfaces of the first and second protection layers at a beginning of the removing;
forming a dielectric layer over the first, second, and third source/drain regions and the first and second protection layers;
forming a contact plug structure extending through the dielectric layer and coupled to the second source/drain region that is arranged between the first and second NSFETs;
forming a memory structure over and coupled to the contact plug structure; and
forming a second interconnect structure over and coupled to the memory structure.

2. The method of claim 1, wherein forming the first protection layer, the second protection layer, the first NSFET, and the second NSFET comprises:
forming spacer layers arranged between semiconductor layers over the first substrate;
forming a first dummy gate structure and a second dummy gate structure over the spacer layers;
removing portions of the spacer and semiconductor layers that do not directly underlie the first and second dummy gate structures, wherein a bottommost spacer layer is not removed and remains completely covered by a bottommost semiconductor layer;
removing outer portions of exposed spacer layers;
forming inner spacer structures on the exposed spacer layers;
removing portions of the bottommost semiconductor layer and the bottommost spacer layer that do not directly underlie the first and second dummy gate structures;
selectively removing the bottommost spacer layer;
forming the first protection layer directly between the first substrate and the bottommost semiconductor layer and directly below the first dummy gate structure;
forming the second protection layer directly between the first substrate and the bottommost semiconductor layer and directly below the second dummy gate structure;
forming the first, second, and third source/drain regions over the first substrate;
removing the first and second dummy gate structures and remaining portions of the spacer layers;
forming the first gate electrode over and between the semiconductor layers that are arranged over the first protection layer to form the first NSFET; and
forming the second gate electrode over and between the semiconductor layers that are arranged over the second protection layer to form the second NSFET.

3. The method of claim 1, wherein the first substrate is a silicon-on-insulator substrate.

4. The method of claim 1, wherein the removing of the first substrate comprises a first etchant, and wherein the first and second protection layers are resistant to removal by the first etchant.

5. The method of claim 1, wherein the contact plug structure overlies the first gate electrode and the second gate electrode.

6. The method of claim 1, wherein forming the first protection layer and the first NSFET comprises:
forming spacer layers between semiconductor layers over the first substrate;
forming a first dummy gate structure over the spacer layers;
removing portions of the spacer and semiconductor layers that do not directly underlie the first dummy gate structure, wherein a bottommost spacer layer is not removed and completely covered by a bottommost semiconductor layer; and
forming the first protection layer directly between the first substrate and the bottommost semiconductor layer and directly below the first dummy gate structure.

7. The method of claim 1, wherein the individual top surfaces of the first, second, and third source/drain regions are recessed relative to the individual top surfaces of the first and second protection layers at an end of the removing.

8. A method comprising:
forming a transistor on a first substrate, wherein the first substrate is a silicon-on-insulator (SOI) substrate comprising an active layer, a base layer, and an insulator layer between the active and base layers;
forming an interconnect structure overlying and electrically coupled to the transistor on a frontside of the transistor;
bonding the first substrate to a second substrate, such that the transistor and the interconnect structure are between the first and second substrates;
removing the first substrate from a backside of the transistor, which is opposite the frontside of the transistor, wherein the removing comprises:
a chemical mechanical polish (CMP) to partially remove the first substrate; and
performing an etch into a remainder of the first substrate after the CMP to remove the remainder of the first substrate; and
forming a memory cell overlying and electrically coupled to a source or drain of the transistor on the backside of the transistors;
wherein the CMP removes the base layer and the insulator layer and the etch removes the active layer.

9. The method of claim 8, further comprising:
depositing a dielectric layer overlying the source or drain of the transistor;
patterning the dielectric layer to form an opening exposing the source or drain of the transistor; and
filling the opening with conductive material to form a contact plug, wherein the memory cell is formed overlying and directly on the contact plug.

10. The method of claim 8, wherein the interconnect structure comprises an alternating stack of wires and vias.

11. The method of claim 10, further comprising:
forming an additional interconnect structure overlying and electrically coupled to the memory cell on the backside of the transistor, wherein the additional interconnect structure comprises an additional alternating stack of wires and vias.

12. The method of claim 8, wherein the bonding comprises:
forming a first bonding layer covering the interconnect structure on the frontside of the transistor;
forming a second bonding layer covering the second substrate; and
bringing the first and second binding layers into direct contact.

13. A method comprising:
forming a transistor on a first substrate, comprising:
- forming a columnar structure, which comprises a plurality of semiconductor layers and a plurality of spacer layers alternatingly stacked; and
- replacing a bottommost spacer layer amongst the plurality of spacer layers with a protection layer;

forming a first interconnect structure electrically coupled to the transistor on a frontside of the transistor;
bonding the first substrate to a second substrate, such that the transistor and the first interconnect structure are between the first and second substrates;
performing an etch into the first substrate to remove the first substrate, wherein the etch stops on the protection layer;
depositing a dielectric layer on a backside of the transistor opposite the frontside of the transistor, such that the transistor and the first interconnect structure are between the second substrate and the dielectric layer;
patterning the dielectric layer to form an opening exposing a source or drain of the transistor;
forming a contact plug filling the opening;
forming a semiconductor device on the contact plug; and
forming a second interconnect structure electrically coupled to the semiconductor device on the backside of the transistor.

14. The method of claim 13, wherein the etch completely removes the first substrate to expose the backside of the transistor between the depositing of the dielectric layer and the bonding.

15. The method of claim 13, wherein the forming of the transistor comprises:
- depositing the plurality of semiconductor layers and the plurality of spacer layers alternatingly stacked on the first substrate;
- performing an additional etch into the plurality of semiconductor layers and the plurality of spacer layers to form the columnar structure; and
- forming a pair of source/drain electrodes, including the source or drain electrode, respectively on opposite sides of the columnar structure; and
- replacing the spacer layers with a gate electrode.

16. The method of claim 13, wherein the semiconductor device and the source or drain overlap along a vertical axis.

17. The method of claim 13, wherein the opening has a T-shaped profile.

18. The method of claim 13, further comprising:
- forming an additional transistor bordering the transistor on the first substrate, wherein the source or drain is shared with the additional transistor.

19. The method of claim 13, wherein the forming of the contact plug comprises:
- forming a silicide layer over the source or drain in the opening;
- depositing a conductive material filling the opening over the silicide layer; and
- performing a planarization into the conductive material.

20. The method according to claim 13, wherein forming the transistor comprises:
- replacing a remainder of the spacer layers with a gate electrode after the replacing of the bottommost spacer layer.

* * * * *